US006768869B2

(12) United States Patent
Constable

(10) Patent No.: US 6,768,869 B2
(45) Date of Patent: Jul. 27, 2004

(54) CAMERA BODY, CAMERA AND METHOD FOR ASSEMBLING SAME

(75) Inventor: Douglas W. Constable, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 60 days.

(21) Appl. No.: 10/127,945

(22) Filed: Apr. 23, 2002

(65) Prior Publication Data

US 2003/0198467 A1 Oct. 23, 2003

(51) Int. Cl.$^7$ ............................................. G03B 17/02
(52) U.S. Cl. ........................... 396/535; 396/542; 396/6; 396/541
(58) Field of Search ................................ 346/542, 535, 346/6, 532, 541

(56) References Cited

U.S. PATENT DOCUMENTS

| | | | |
|---|---|---|---|
| 3,517,255 A | 6/1970 | Hoffer et al. | |
| 3,519,879 A | 7/1970 | Ogawa | |
| 3,864,600 A | 2/1975 | Schneider | |
| 4,001,640 A | 1/1977 | Biber | |
| 4,082,983 A | 4/1978 | Adams, Jr. | |
| 4,084,167 A | 4/1978 | Iwata | |
| 4,110,770 A | * 8/1978 | Lange | 396/541 |
| 4,196,458 A | 4/1980 | Kondo | |
| 4,322,143 A | 3/1982 | Mailanda | |
| 4,348,087 A | 9/1982 | Ellin et al. | |
| 4,438,561 A | 3/1984 | Mueller | |
| 4,751,538 A | * 6/1988 | Konno | 396/543 |
| 4,769,665 A | * 9/1988 | Dagborn | 396/213 |
| 4,924,149 A | 5/1990 | Nishida et al. | |
| 5,329,330 A | 7/1994 | Sakai et al. | |
| 5,502,526 A | * 3/1996 | Katano | 396/535 |
| 5,574,337 A | 11/1996 | Dunsmore | |
| 5,708,878 A | 1/1998 | Suh | |
| 5,717,962 A | 2/1998 | Sasaki et al. | |
| 5,721,986 A | 2/1998 | Nomura et al. | |
| 5,814,948 A | 9/1998 | Teremy | |
| 5,930,545 A | * 7/1999 | Petruchik et al. | 396/542 |
| 6,574,430 B1 | * 6/2003 | Constable | 396/6 |
| 2002/0164163 A1 | 11/2002 | Katsura et al. | 396/159 |

FOREIGN PATENT DOCUMENTS

| | | |
|---|---|---|
| JP | 330928 | 5/2000 |
| JP | 209095 A | 8/2001 |
| JP | 228512 A | 8/2001 |

* cited by examiner

Primary Examiner—Russell Adams
Assistant Examiner—Michael Dalakis
(74) Attorney, Agent, or Firm—Roland R. Schindler, II

(57) ABSTRACT

In one aspect of the invention, what is provided is a camera body adapted to be joined to a cover having an outer electronic circuit with a set of electrical contacts, said contacts being positioned by the cover in relation to an aperture. The camera body comprises a primary electronic circuit with a set of electrical contacts adapted to engage the electrical contacts of the outer electronic circuit and to cooperate therewith to perform a set of camera functions when the set of electrical contacts from the outer electronic circuit is held against the set of electrical contacts from the inner electronic circuit. A post is aligned with the set of electrical contacts of the inner electronic circuit said post being adapted to engage an aperture in the cover so that as the cover is joined to the body, the set of electrical contacts from the outer electronic circuit is aligned with the set of electrical contacts from the inner electronic circuit.

36 Claims, 22 Drawing Sheets

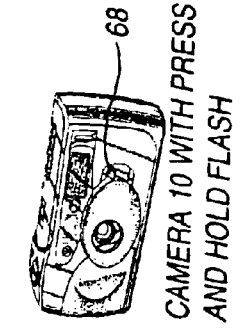

FIG. 21a

COVER 14a,
SECOND CIRCUIT 250 WITH
ONE TOUCH CIRCUIT

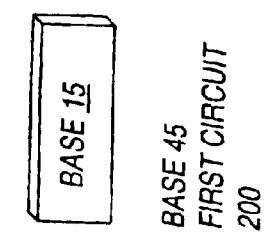

FIG. 21b

COVER 14b,
SECOND CIRCUIT 251 WITH
ONE TOUCH, TIMEOUT
CIRCUIT 270 AND AUTO-RESTART
CIRCUIT 280

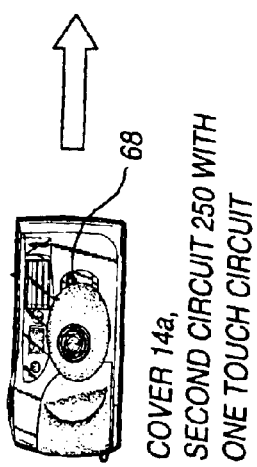

FIG. 21c

COVER 14c,
SECOND CIRCUIT 252 WITH
ONE TOUCH, TIMEOUT
CIRCUIT 270 AND AUTO-RESTART
CIRCUIT 280 AND FATBIT
RECORDING CIRCUIT 290

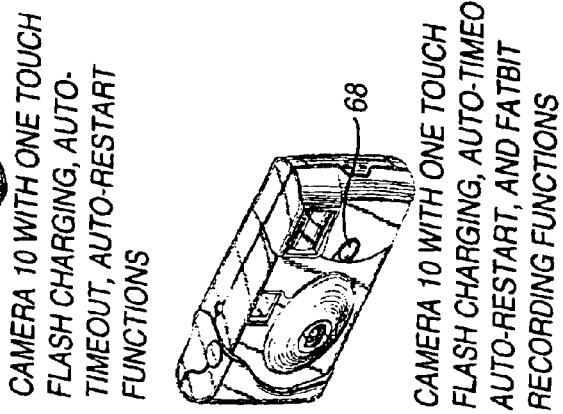

BASE 15

BASE 45
FIRST CIRCUIT
200

→ CAMERA 10 WITH PRESS
AND HOLD FLASH

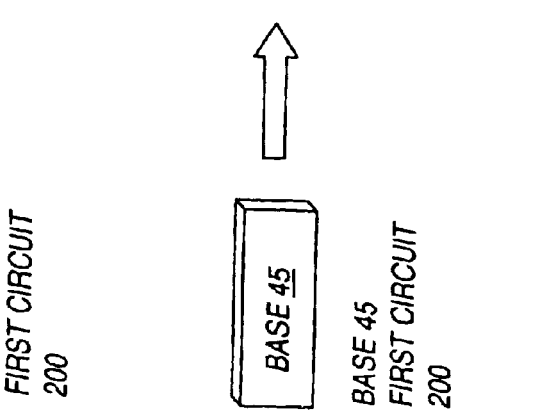

BASE 45

BASE 45
FIRST CIRCUIT
200

→ CAMERA 10 WITH ONE TOUCH
FLASH CHARGING, AUTO-
TIMEOUT, AUTO-RESTART
FUNCTIONS

BASE 45

BASE 45
FIRST CIRCUIT
200

→ CAMERA 10 WITH ONE TOUCH
FLASH CHARGING, AUTO-TIMEOUT,
AUTO-RESTART, AND FATBIT
RECORDING FUNCTIONS

CAMERA BODY, CAMERA AND METHOD FOR ASSEMBLING SAME

CROSS REFERENCE TO RELATED APPLICATIONS

Cross reference to related application Ser. No. 10/033,560 entitled RECYCLABLE CAMERA AND METHOD FOR ASSEMBLING SAME filed in the name of Douglas W. Constable on Dec. 27, 2001, and Ser. No. 10/033,482 entitled CAMERA ELECTRONIC SYSTEM AND METHOD OF ASSEMBLING SAME filed in the name of Douglas W. Constable on Dec. 27, 2001.

FIELD OF THE INVENTION

The present invention relates to the field of recyclable photographic cameras and more particularly to recyclable cameras that incorporate electronic circuits.

BACKGROUND OF THE INVENTION

One time use cameras of the type that are pre-loaded with film, used once by a purchaser, and returned to a photofinisher for processing of the film are becoming increasingly popular with photographers. Principal reasons for this popularity include the low cost and high quality of the images captured using these cameras. One reason that one time use cameras can be sold at low cost is that many of the components used in one time use cameras are recycled by the manufacturer after a purchaser has completed exposing the pre-loaded film and turned the camera over to a photofinisher for development of the film. See for instance, Sakai et al. U.S. Pat. No. 5,329,330. Therefore, many components of one time use cameras are designed to last through a suitable number of cycles of sale, use, reconstruction, and resale.

With the increasing popularity of recyclable cameras, consumers have indicated a desire for recyclable cameras having a wider variety of features. In particular, consumers have shown an interest in, for example, features such as a camera flash and the ability to record metadata on the film or in association with the film. Such features, in turn, require that one time use cameras have camera electronic systems that execute a set of functions necessary to perform the features. As a result, different types of camera electronic systems have been developed, with each different type performing a different set of functions.

Camera electronic systems, however, are relatively expensive components of one time use cameras. Thus, it is important that camera electronic systems are readily recyclable. However as the number of different types of camera electronic systems introduced by a manufacturer increases, the ability of the manufacturer to distribute the development costs for each type of camera electronic system proportionately decreases. This causes a net increase in the per unit cost of each type of camera electronic system. Further, different types of camera electronic systems are typically not compatible with the other types. This increases logistical problems during recycling making the recycling process more complex and expensive which, in turn, also causes a net increase in the cost of such cameras.

Thus, what is needed is a low cost camera electronic system that can be used in more than one different type of one time use camera.

In the electronics industry, it is known to provide circuit boards that contain all of the components necessary to cause the circuit board to perform at least two different functions. Such boards often provide jumper sites or selectable Dual In-line Package pins to allow a manufacturer, user, or other serviceperson to select the mode operation of the board by selectably positioning jumpers or selecting particular Dual In-line Package pins. Often, such circuit boards incorporate all of the componentry necessary to perform both functions. In such an embodiment, the base circuit board also provides jumper sites with properly positioned jumpers and/or an additional selectable Dual In-line Package pin structure. This adds cost, size, weight and complexity to the circuit board. Further, this creates potential quality problems in that improper jumper alignment or improper Dual In-line Package pin settings are easily overlooked during recycling.

Alternatively, it is known in the art to provide a circuit board having at least one frangible portion with circuit traces passing through the frangible portion. The operation of the circuit board is altered by breaking off the frangible portions so that selected circuit traces are interrupted causing the circuit board to operate in a different way. However, here too, the circuit board must provide all of the componentry necessary to perform more than one set of camera functions. Further, it is time consuming and expensive to replace the frangible portion during recycling.

In the electronics industry, it is also known to mechanically rework printed circuit boards by removing conductive traces from the circuit board and soldering wires to remaining traces to form new circuit patterns. It will be appreciated that this is a costly and time-consuming way to perform recycling. U.S. Pat. No. 4,438,561 shows a method of reworking a circuit board by adhering a flexible circuit having a non-conductive substrate to the circuit board. The non-conductive substrate has a circuit trace which acts as a jumper and joins two portions of a circuit together. This alters the underlying circuit system of the printed circuit board permitting the combined circuit board to operate in an altered manner. However, this method is directed at the problem of performing a single rework or repair to the circuit board. This does not address the problem of removing the flexible circuit from the non-conductive substrate and does not provide a cost efficient mechanism to recycle the printed circuit board.

Thus, what is needed, is a low cost camera electronic system of a first type that is readily modifiable to perform functions that are associated with a second type.

One approach for meeting this need is used by circuit boards that have a first circuit having a basic functionality to which additional circuits can be joined in order to add functionality to the first circuit. Examples of this include Japanese Patent Application 2001-228412A entitled "Strobe Unit and Its Manufacturing Method" and Japanese Patent Application 2001-209095A entitled "Strobe Unit and Its Manufacturing Method". Each of these patent applications show a camera flash circuit board having a first circuit with a power supply, a voltage step up circuit, and a flash circuit to start the flash of a flash tube. Each of these circuit boards is also adapted with mountings and appropriate electrical circuitry to permit the boards to be combined with a second circuit member to add additional functionality to the first circuit. In each of these patent applications, the second circuit member is joined to the circuit board and thereby combined with the first circuit board to perform additional functions such as detecting the brightness of a scene in order to disable a flash, to quench a flash and/or to enhance the brightness of a flash.

In each of the '412 and '095 patent applications, the first circuit is physically joined to the second circuit in a manner that prevents separation. The combined circuits are installed into the camera. During recycling the first and second circuit boards must be physically separated. This joining and separating requires additional labor during the manufacturing and recycling processes. Further, this joining and separating can cause physical damage to the components of either the first circuit board or the second circuit board.

Another approach is described in Japanese Patent Application 2001-330928A. As is shown in this application, a camera mainframe having a first circuit board is joined to a camera cover having a second circuit board. Conductive contact pieces are fixed on a back of the second circuit board. The contact pieces are resilient and are pressed against the first circuit board when the cover is joined to the mainframe. The contact pieces form an electrical connection with a conductive pattern on the first circuit board thus permitting electricity to flow from the first circuit board to the second circuit board.

It will be appreciated that, in such a camera, the alignment of the contact pieces and the conductive pattern is critical. However, in the camera described in the '928 application, the alignment is a function of the dimensional tolerances of the conductive surfaces, the mainframe, the linkage between the mainframe and the cover, the cover, and the second circuit board. The cumulative effect of these tolerances can make alignment of the contact pieces and the conductive pattern difficult to establish and maintain. This can cause the camera to perform in an unintended manner.

Thus, what is needed is a method for assembling and recycling a camera that combines two or more electronic circuits in a way that reduces the labor and risk of damage incident to the joining of the first and second circuit boards while ensuring that the electronic circuits stay in joined relationship during the life cycle of the one time use camera. What is also needed is a method for assembling and recycling the camera that reduces the amount of labor and the risk of damage that is incident with the separation of the circuit boards.

It will also be appreciated that during the recycling process, it is necessary to provide positive assurance that the camera system is operating as a camera of the first type or a camera of the second type. Thus, what is also needed is a camera system having a second circuit, the presence of which is easily detectable after manufacture by testing or quality assurance monitoring equipment.

Finally what is desired is a method for assembling and recycling cameras that minimizes the cost of the camera and of assembling and recycling the camera.

SUMMARY OF THE INVENTION

In one aspect of the present invention, what is provided is a camera body adapted to be joined to a cover, the cover having an outer electronic circuit with a set of electrical contacts, said contacts being positioned by the cover in relation to an aperture. The camera body comprises an inner electronic circuit with a set of electrical contacts adapted to engage the electrical contacts of the outer electronic circuit and to cooperate therewith to perform a set of camera functions when the set of electrical contacts from the outer electronic circuit is held against the set of electrical contacts from the inner electronic circuit. A post is aligned with the set of electrical contacts of the inner electronic circuit, the post being adapted to engage the aperture in the cover so that as the cover is joined to the body, the set of electrical contacts from the outer electronic circuit is aligned with the set of electrical contacts from the inner electronic circuit.

In another aspect, what is provided is a camera body adapted to be joined to a cover, the cover having an outer electrical circuit with a set of electrical contacts. The camera body comprises an inner circuit board having a passageway and an inner circuit with a set of electrical contacts adapted to engage the electrical contacts of the outer electronic circuit and to cooperate therewith to perform a set of camera functions when the contacts of the inner electronic circuit are held against the electrical contacts of an outer electronic circuit. A post is adapted to engage the passageway of the inner circuit board to align the electrical contacts of the inner circuit with the post. The post is further adapted to engage the aperture of an outer circuit board and to align the electrical contacts of the outer electronic circuit with the electrical contacts of the inner electronic circuit. The contacts of the outer electrical circuit are held against the contacts of the inner electrical circuit when the body is joined to such a cover.

In another aspect, what is provided is a camera comprising a frame having a first electronic circuit with a first set of electrical contacts with the first set of electrical contacts adapted to engage a second set of electrical contacts from a second electronic circuit and to cooperate therewith to perform a set of camera functions when said first set of contacts is held against said second set of electrical contacts. An image capture system is provided and joined to the frame. A cover is provided and is joinable to the frame with said cover having the second electronic circuit and with said cover positioning said second set of electrical contacts. A post is fixed in spaced relation to the first set of electrical contacts, said post adapted to engage an aperture in the cover to align the second set of electrical contacts so that as the cover is joined to the frame the second set of electrical contacts is aligned with the first set of electrical contacts is held against the first set of electrical contacts.

In still another aspect, what is provided is a camera having a frame joined to a first circuit board with the first circuit board having a passageway and a flash circuit. Said flash circuit having a first set of electrical contacts adapted to engage a second set of electrical contacts from a second electronic circuit and to cooperate therewith to perform a set of camera functions when said first set of contacts is held against said second set of electrical contacts. An image capture system is joined to the frame. A cover having a second circuit board with the second circuit board having the second electronic circuit and the second set of electrical contacts, said cover positioning the second circuit board so that the second set of electrical contacts is movable relative to the cover. A post is provided and extends between the frame and the cover, with said post adapted to engage said passageway and said aperture to align the passageway and the aperture so that when the cover is joined to the frame the second set of electrical contacts is aligned with the first set of electrical contacts and the second set of contacts is held against the first set of electrical contacts. In still another aspect of the present invention, what is provided is a method for assembling a camera. In accordance with this method, a base is obtained having a first electronic circuit adapted to join with more than one second electronic circuit. The desired set of functions that the camera is to perform is identified. A second cover having a second electronic circuit that is adapted to join with the first electronic circuit to perform the desired set of camera functions is provided. A common positional reference between the first electronic circuit and the second positional circuit is defined and the first electronic circuit and the second electronic circuit are aligned relative to the common positional reference. The first electronic circuit and the second electronic circuit are positioned together so that they can cooperate.

BRIEF DESCRIPTION OF THE DRAWINGS

FIG. 21a shows one embodiment of a camera formed using a common base;

FIG. 21b shows another embodiment of a camera formed using the common base;

FIG. 21c shows yet another embodiment of a camera formed using the common base;

DETAILED DESCRIPTION OF THE INVENTION

Figure 1:
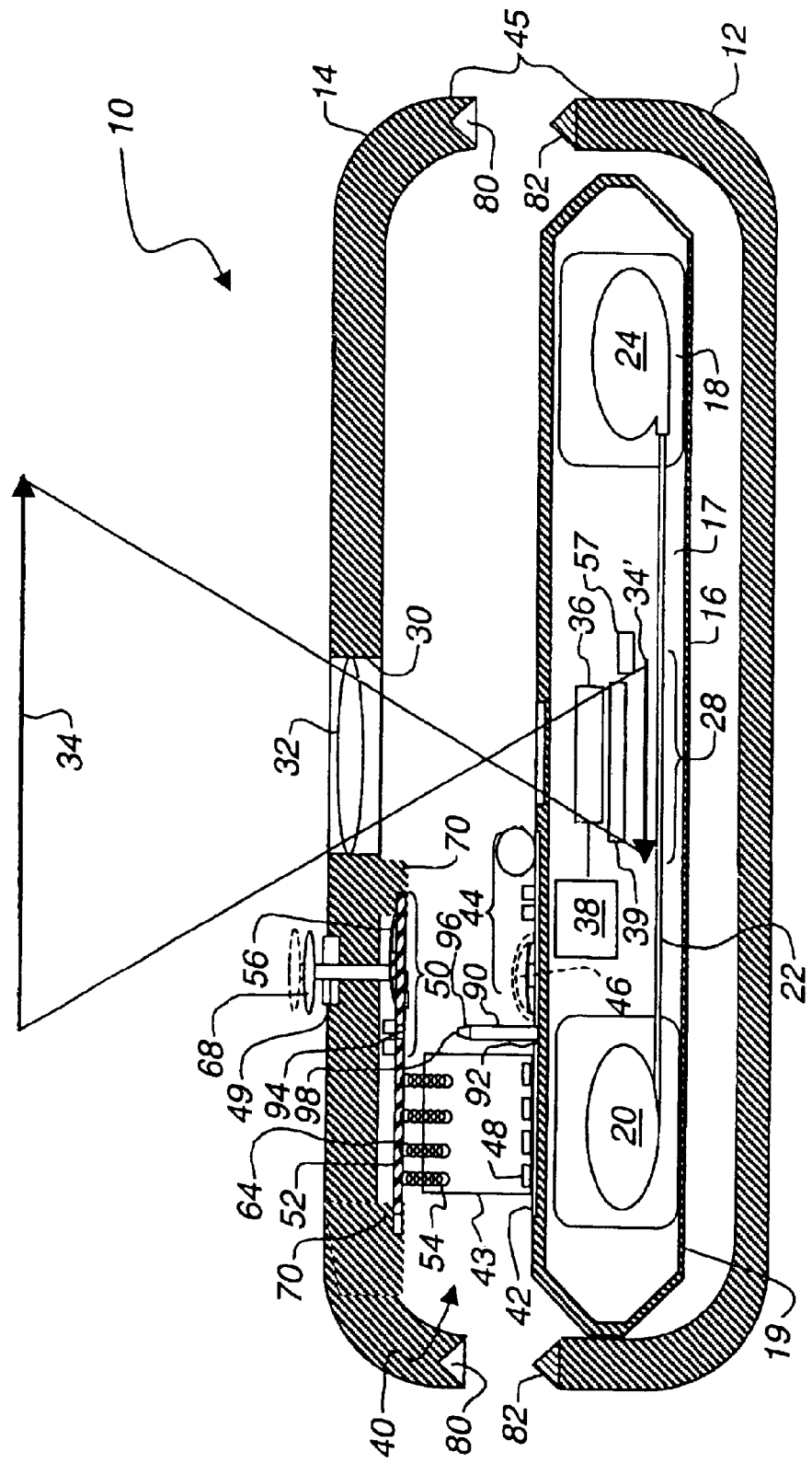
FIG. 1 shows a cross-section assembly diagram of an embodiment of a camera having a first electronic circuit and a cover with a second electronic circuit.

Turning now to FIG. 1 what is shown is a diagram of an embodiment of camera 10 of the present invention. As shown in FIG. 1, camera 10 has a first cover 12 and a second cover 14. Frame 16 is disposed between first cover 12 and second cover 14. Frame 16 can be a component that is separate from but joined to first cover 12. Alternatively, frame 16 can be formed in whole or in part by features of first cover 12. In the embodiment shown, frame 16 supports film path 17 having a film take up reel area 18, a film supply spool area 19, a film supply spool 20 and a film take up reel 24.

In the embodiment shown, a length of film 22 is stored on supply spool 20 when camera 10 is manufactured. Take-up reel 24 is revolved by a winding mechanism (not shown) to draw film 22 from film supply spool 20 and onto film take-up reel 24. Disposed between supply spool 20 and take-up reel 24 is an image capture area 28. Second cover 14 has an opening 30 aligned with image capture area 28. Lens 32 is disposed in opening 30 to focus light from a scene 34 to form an image of scene 34' on film 22. Shutter system 36 is disposed between lens 32 and film 22 to control the amount of light to which film 22 is exposed during image capture.

An image is captured on film 22 when the camera user presses shutter release 38. Shutter release 38 causes shutter system 36 to move a shutter blade 39 from a position that blocks light from passing from lens 32 to film 22, to a position permitting light to pass from lens 32 to film 22. Typically, shutter system 36 stays in a position that allows light to pass for a predetermined period of time. After this predetermined period of time has passed, shutter system 36 returns to the blocking position thus completing the exposure cycle.

As is shown in FIG. 1, camera 10 incorporates a camera electronic system 40. Camera electronic system 40 comprises a first circuit board 42 having a first electronic circuit 44. In the embodiment shown, first electronic circuit 44 performs primary camera flash functions: flash capacitor charging and flash tube discharge. A dome switch 46 is shown in first electronic circuit 44. The dome switch 46 causes flash energy to be stored in first electronic circuit 44. Dome switch 46 must be held closed until flash charging is completed. A movable member (not shown) can be used to permit a user of camera 10 to depress dome switch 46. First circuit board 42 with first electronic circuit 44 therefore has what is known in the art as "press and hold" functionality. That is, the user of camera 10 presses and holds down dome switch 46 until enough energy is stored to permit a flash of light to be discharged from flash tube 43. This charge is discharged during an exposure cycle. The discharge is triggered by a synchronization switch 57 which closes in response to movement of shutter blade 39.

Figure 2:
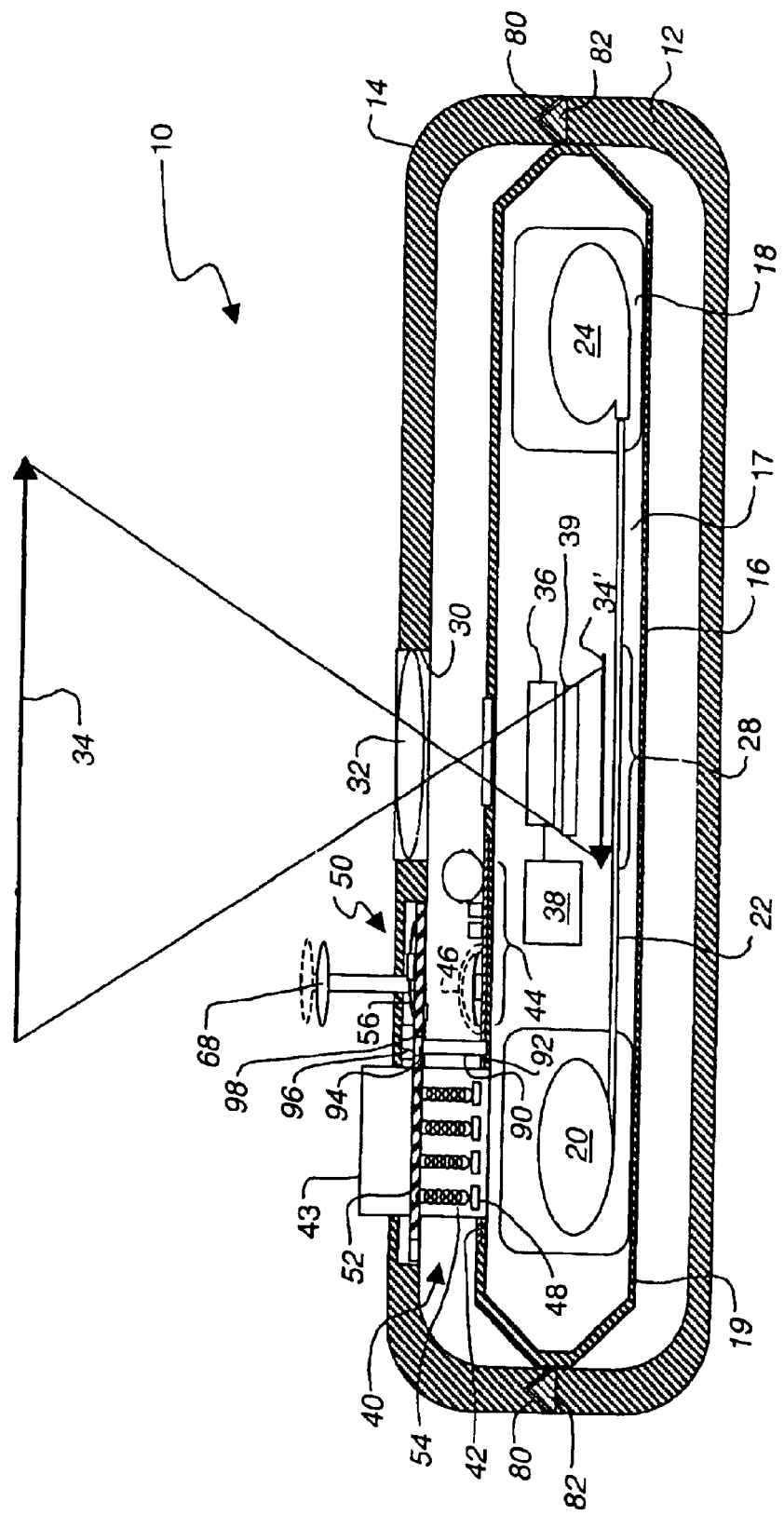
FIG. 2 shows a diagram of the embodiment of FIG. 1 with the camera assembled.

As is also shown in FIG. 1, first electronic circuit 44 also comprises a first set of electrical contacts 48 which are adapted to mate with a second set of electrical contacts 54 of a second electronic circuit 50. In the embodiment of FIGS. 1 and 2, second electronic circuit 50 is located on a second circuit board 52. In the embodiment shown, the second set of electrical contacts 54 comprise resilient compression springs. Alternatively, other resilient conductors such as brushes or levers can be used. Although not preferred, solid connectors such as rods and pins can also be used.

When an electrical connection is made between the first set of electrical contacts 48 and the second set of electrical contacts 54, a combination electronic circuit is created that is capable of performing a second set of camera functions.

In one embodiment, first electronic circuit 44 provides components that are capable of performing a first set of functions and the second electronic circuit 50 provides additional components and circuitry that enables the combined circuit to execute a second set of functions that is different than the set of functions that can be performed by the components of the first electronic circuit 44 alone. This second set of functions can be related to the first set of functions such as where first electronic circuit 44 provides a camera flash feature and the combination of the first electronic circuit 44 with the second electronic circuit 50 provides what is known in the art as a "one touch flash charging circuit". In a one touch flash charging circuit, the user of camera 10 needs only to depress the driving member 68 once to cause a full measure of flash charge to be stored in the first electronic circuit 44. Also in the combination circuit, charging continues for a predefined period of time after full charge is reached, the charging is then automatically stopped after this predefined period of time. This latter aspect of the charging circuit is known as a time-out feature.

The second set of camera functions can also be unrelated to the first set of camera functions. This can occur, for example, where first circuit board 42 provides a first electronic circuit 44 that performs a default set of camera functions necessary to provide an electronic flash feature while second electronic circuit 50 provides, for example, audio capture circuitry.

Further, the second set of camera functions does not necessarily need to be more complex than the first set of camera functions, as it may occur that the second set of camera functions is less complex but requires a more costly electronic circuit structure than that which is provided for on first circuit board 42. In such a circumstance, the second electronic circuit 50 provides the electronic circuit structure necessary to cooperate with the first electronic circuit 44 to perform the less complex feature set.

By using such a camera electronic system 40, a family of different one time use cameras can be developed that incorporate first circuit board 42. This common use of first circuit board 42 reduces the development costs and cost of recycling each camera 10 in the family.

However, it is important to the recyclability of the camera electronic system 40 that first electronic circuit 44 and second electronic circuit 50 can be combined and separated with a minimum of extra effort and expense. Further, it is important that first electronic circuit 44 and second electronic circuit 50 are joined together so that the first set of electrical contacts 48 can separate from the second set of electrical contacts 54 during recycling without substantial risk of damage to first circuit board 42, first electronic circuit 44, second electronic circuit 50 and second circuit board 52.

In the embodiment shown in FIGS. 1 and 2, first cover 12, frame 16, film path 17 and first circuit board 42 are integrated into camera body 45. Second cover 14 and second circuit board 52 are joined and second cover 14 is adapted to be fixed to camera body 45. In this regard, second cover 14 has a pair of cover mating surfaces 80 shaped to engage a pair of body mating surfaces 82. In the embodiment shown, body mating surfaces 82 are located on first cover 12. To assemble first cover 12 and second cover 14, cover mating surfaces 80 and body mating surfaces 82 are used. This aligns first cover 12 with second cover 14. Because first cover 12 positions first circuit board 42 and second cover 14 positions second circuit board 52, alignment of first cover 12 with second cover 14 provides general alignment of the first set of electrical contacts 48 with the second set of electrical contacts 54.

Precise alignment of first set of electrical contacts 48 with the second set of electrical contacts 54 is assured by the provision of an alignment post 90. In the embodiment shown, alignment post 90 is provided on frame 16. Alignment post 90 projects from frame 16 toward second cover 14. First circuit board 42 has a first passageway dimensioned to mate with the outer perimeter 91 of alignment post 90. Second circuit board 52 is joined to second cover 14 by way of a mounting 70 that permits a degree of movement of second circuit board 52 relative to second cover 14. Second circuit board 52 has an aperture 94 that is also adapted to engage alignment post 90. In the embodiment shown, alignment post 90 has a tapered portion 96 at an end 98 that confronts second circuit board 52. As second cover 14 is joined to first cover 12, end 98 enters aperture 94. As the assembly of first cover 12 and second cover 14 continues, tapered portion 96 passes along aperture 94. Where aperture 94 is not aligned with alignment post 90, the tapered portion 96 engages aperture 94 and moves second circuit board 52 so that the second set of electrical contacts 54 are aligned with the first set of electrical contacts 48 when first cover 12 is joined to second cover 14. The geometric shape of alignment post 90, passageway 92 and aperture 94 will typically be defined in a consistent manner. In this regard, alignment post 90 provides one shape in cross-section with passageway 92 and aperture 94 shaped to match cross-sectional shape of alignment post 90 with passageway 92 and aperture 94 being sized within a range of sizes that ensure that the degree of any mismatch between the sizes so that a tight fit exists between alignment post 90 and passageway 92 and the size of alignment post 90 and aperture 94 when first cover 12 is fully joined to second cover 14 is limited to a degree that will functionally align the first set of electrical contacts with the second set of electrical contact notwithstanding the degree of mismatches. Thus, in accordance with the present invention, first circuit board 42 and second circuit board 52 can be aligned using alignment post 90 as a single reference. This alignment in turn more precisely aligns the first set of electrical contacts 48 and second set of electrical contacts 54.

Figure 3B:
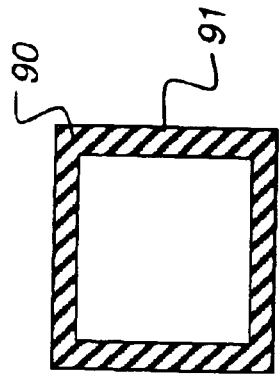
FIGS. 3a–3d show various examples of cross sectional shapes of alignment post that can be usefully employed.
Figure 3D:
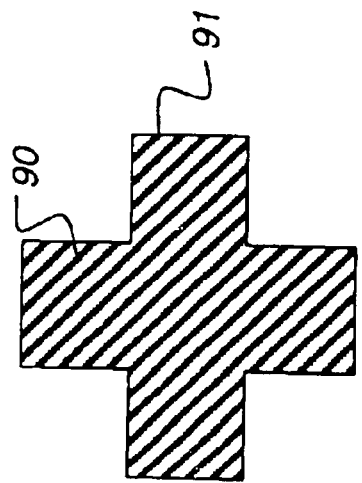
Figure 3A:
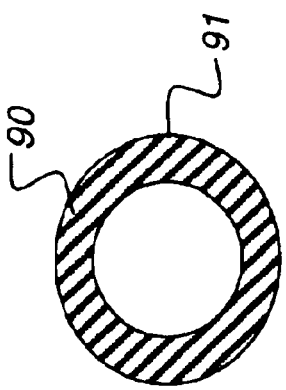
Figure 3C:
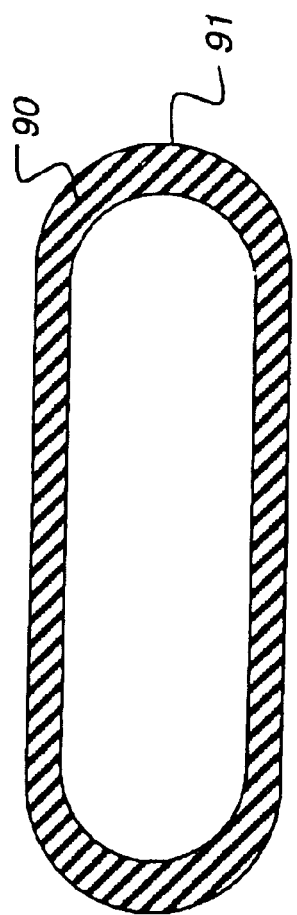
Figure 4B:
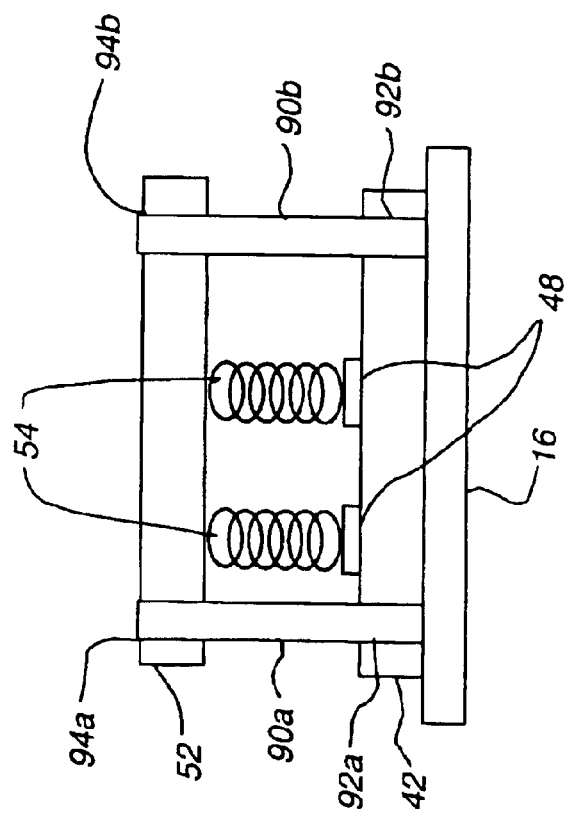
FIGS. 4a and 4b depict respectively top and side views of a first and second circuit board joined by more than one alignment post.
Figure 4A:
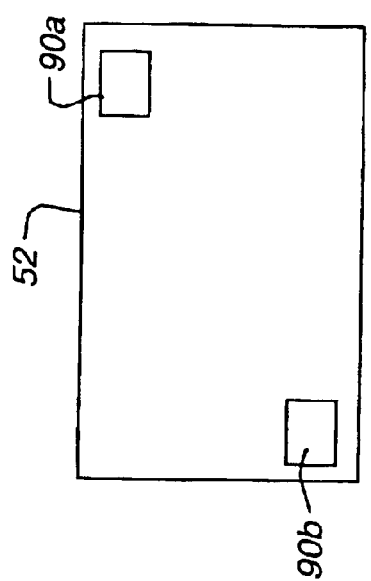

As is shown in FIGS. 3a–3d, alignment post 90 can have various cross sectional shapes. In FIG. 3a, a simple circular shape is used. In FIG. 3b, a rectangular shape is used. This shape helps to locate the second circuit board 52, along two axes as well as to pivotally locate the second circuit board 52. Similarly, an oval shape of the type shown in FIG. 3c or a swiss cross shape of the type shown in FIG. 3d can be used to provide biaxial and pivotal locations. In one embodiment, camera 10 has more than one alignment post 90. In this embodiment first circuit board 42 provides more than one passageway adapted to receive the more than one alignment post 90. Also in this embodiment, second circuit board 52 provides more than one aperture adapted to receive the more than one alignment post 90. An example of this is shown in FIGS. 4a and 4b which depict respectively top and cross section views of a first circuit board 42 with a first passageway 92a and a second passageway 92b. Camera 10 of this embodiment also has a second circuit board 52 with a first aperture 94a and a second aperture 94b. First post 90a engages first passageway 92a and first aperture 94a when second cover 14 is joined to first cover 12. Similarly, second post 90b engages second passageway 92b and second passageway 94b. This closely aligns the first circuit board 42 with the second circuit board 52 and the first set of electrical contacts 48 with the second set of electrical contacts 54 as is described above.

It will be appreciated that while the body mating surfaces 82 are shown and described as being part of first cover 12, body mating surfaces 82 can be located on other structures of camera body 45 such as frame 16. Further, any useful arrangement of cover mating surfaces 80 and body mating surfaces 82 can be usefully employed to generally align the camera body 45 and second cover 14. In one embodiment, cover mating surfaces 80 and body mating surfaces 82 define a connector arrangement such as a snap fastener or other fastener known in the art.

The first set of electrical contacts 48 and the second set of electrical contacts 54 are pressed together by the act of assembling second cover 14 to camera body 45. The first set of electrical contacts 48 and second set of electrical contacts 54 are held in contact until second cover 14 is separated from camera body 45. In this way, first electronic circuit 44 can be joined to second electronic circuit 50 so that first electronic circuit 44 and second electronic circuit 50 can cooperate to perform the second set of functions. This substantially reduces the possibility that first electronic circuit 44 or second electronic circuit 50 will be damaged by the process of mechanically joining or separating the electrical circuits and reduces the amount of labor that must be used to join and to separate electrical circuits.

The co-operation of the first electronic circuit 44 and second electronic circuit 50 in the embodiment shown in FIGS. 1 and 2 will now be described. First circuit board 42 has a first electronic circuit 44 that is capable of generating a flash of light to provide supplemental illumination to a photographic scene as generally described above. In the embodiment of FIGS. 1 and 2, the first electronic circuit 44 incorporates a dome switch 46 that activates a flash charging circuit that operates in the press and hold mode as is described above. The first electronic circuit 44 also comprises a flash discharge circuit for discharging a flash of light from flash tube 43 to illuminate the scene. First circuit board 42 is shown fixed to camera frame 16 and arranged thereon so that the first set of electrical contacts 48 are confrontingly aligned with the portion of second cover 14 having second electronic circuit 50.

Second electronic circuit 50 and second circuit board 52 are arranged to cooperate with driving member 68 which passes through an opening 49. In this regard, FIGS. 1 and 2 show a switch 56 disposed in the path of driving member 68 which allows second electrical circuit 50 to operate in response to movement of driving member 68. In this embodiment, second electronic circuit 50 reacts to the closure of switch 56 by cooperating with first electronic circuit 44 to store a full charge of flash energy in response to only one momentary depression of driving member 68. Thus, camera 10 provides a "one touch" charging capability. Importantly, however, camera body 45 having first electronic circuit 44 with dome switch 46 used for press and hold functionality can be used in camera 10 having one touch functionality without compromising the ability of camera body 45 to be used or reused in camera 10 having a press and hold function.

It will further be appreciated that to reduce the cost of first circuit board 42, or for other reasons, first circuit board 42 and first electronic circuit 44 can be defined in such a manner that activation of certain functions of the first electronic circuit 44 interferes with the performance of one or more of the second set of camera functions. Under such circumstances it is necessary to prevent the first electronic circuit 44 from performing the interfering functions. In the embodiment shown, in FIGS. 1 and 2, the first electronic circuit 44 is prevented from executing "press and hold" charging functions because second cover 14 does not provide a driving member 68 to engage dome switch 46 and therefore the press and hold function of first electronic circuit 44 cannot interfere with the performance of the one-touch charging functions that camera 10 is capable of performing when second cover 14 has a second set of camera functions. Similarly, it will be appreciated where first electronic circuit 44 incorporates other sensors or devices that interact with the environment outside of camera 10, it is possible detect to disable functions of the first electronic circuit 44 by preventing such sensors or other devices from detecting environmental conditions.

It will be appreciated that the presence or absence of features in second cover 14 preventing or permitting switches, sensors or other detectors to access the environment outside of camera 10 can be used to identify the type of functions that camera 10 is capable of performing. In this way, the functions that a particular camera 10 is capable of performing can be determined from the exterior of camera 10 using machine vision, tactile sensing or other optical, electronic or mechanical means known to those of ordinary skill in the art. Thus, for example, where a common base is used in recycling or manufacturing a family of cameras 10 each distinguished by a different second cover 14, it is possible to provide positive assurance that a particular camera 10 performs a particular set of functions using machine based examination of second cover 14.

For example, in the embodiment of FIGS. 1 and 2, the location of driving member 68 can be used to identify the functions that camera 10 is capable of performing. Where driving member 68 is not positioned in alignment with the known position of switch 46, then it can readily be determined that camera 10 is not capable of executing the press and hold functions. Further, the functions that camera 10 having second cover 14 is capable of performing can be determined by examining, for example, the location of driving member 68 so long as each second cover 14 having a different set of functions places driving member 68 in a different position. Similar results can be obtained by examining a second cover 14 of camera 10 to determine which sensors or other detectors are provided in a particular second cover 14.

Figure 5:
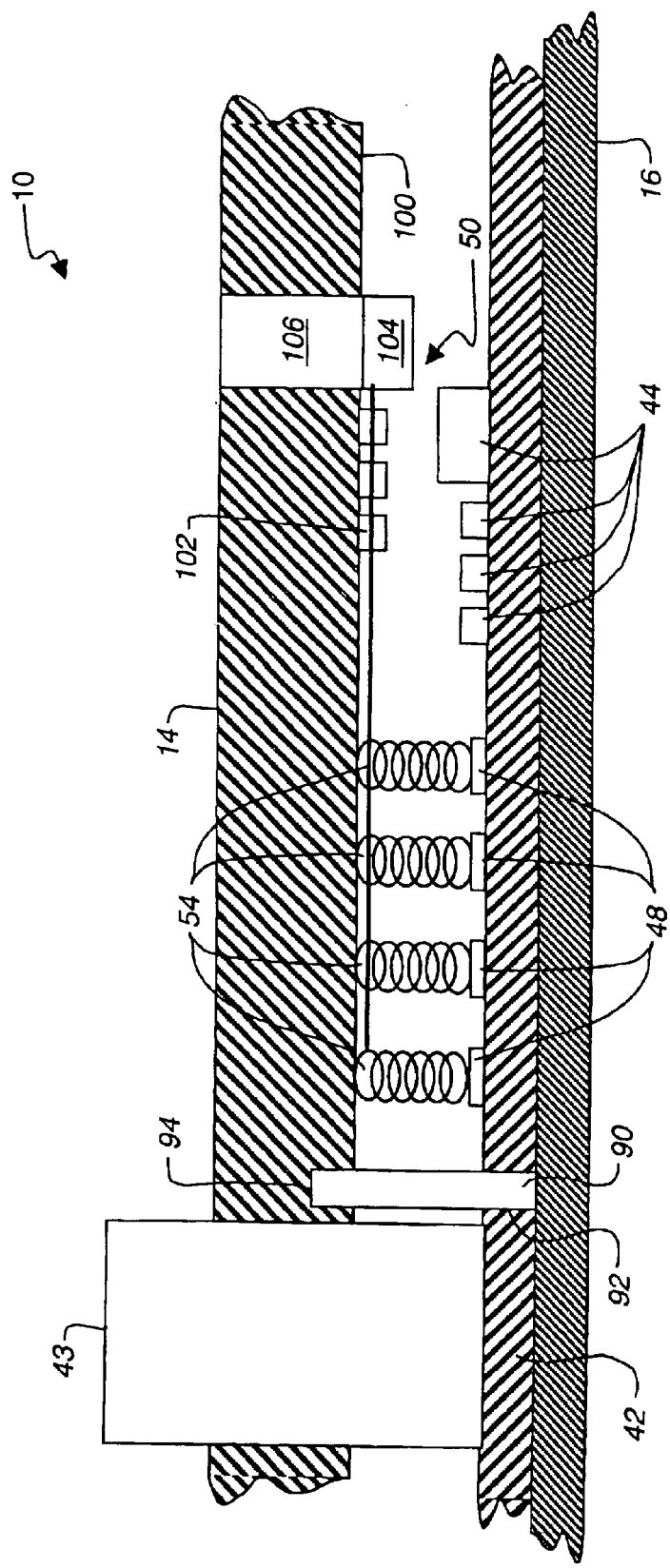
FIG. 5 shows one embodiment of a camera having a second cover with an inner surface and a second electronic circuit assembled on the inner surface.

It will be appreciated that, in the above described embodiments, second electronic circuit 50 has been shown and described as being mounted on a second circuit board 52. However, it will be appreciated that, consistent with the principles of the present invention, second circuit board 52 can be omitted as is shown in FIG. 5 by assembling components 102 of second electronic circuit 50 on inner surface 100 of second cover 14. In this way, second cover 14 can be used in the place of second circuit board 52 thus lowering the cost of the camera, reducing the size of the camera, and eliminating the need to fix second circuit board 50 to inner surface 100 of second cover 14. In such an embodiment, second cover 14 is joined to camera body 45 in a manner that permits second cover 14 to move relative to camera body 45. In this embodiment precise alignment of second cover 14 and the second set of electrical contacts 54 is provided by defining aperture 94 in second cover 14 and using alignment post 90 to position the second cover 14 so that the first set of electrical contacts 48 are aligned with the second set of electrical contacts 54.

Figure 6:
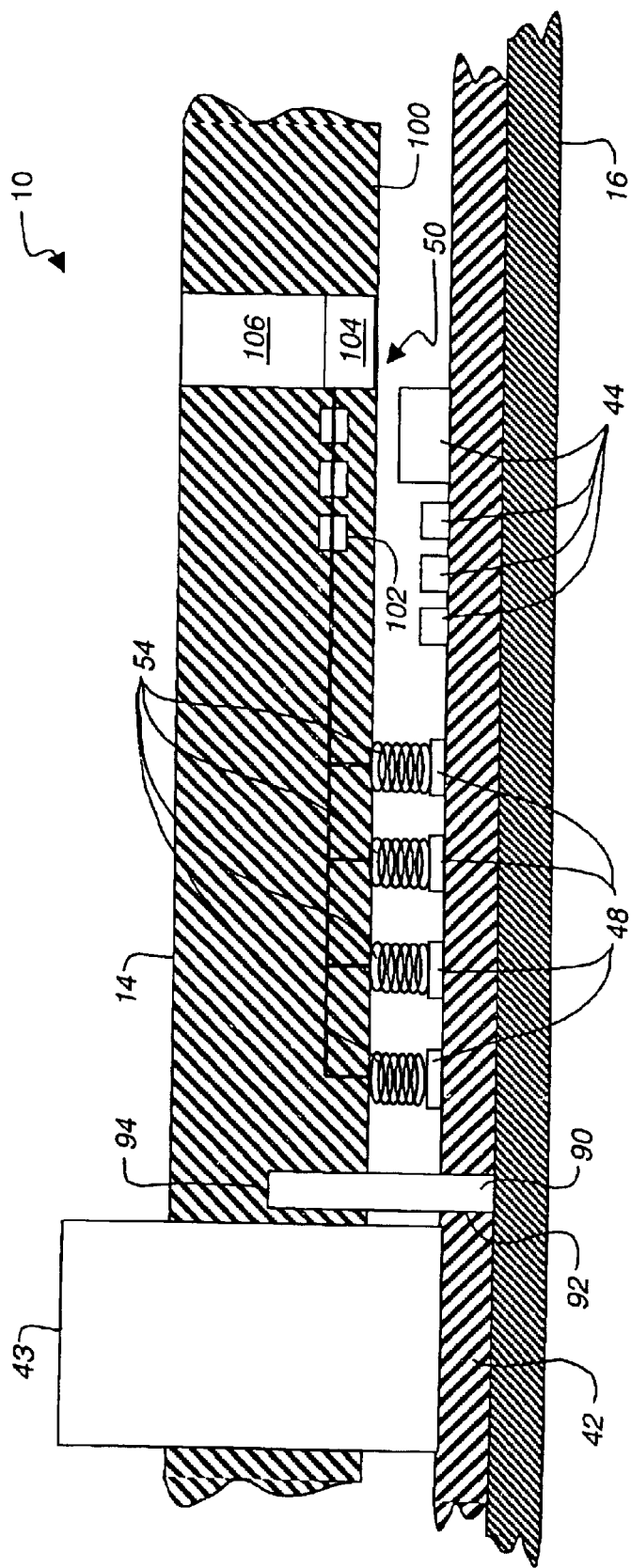
FIG. 6 shows an embodiment of a camera having a second cover with a second electronic circuit formed in the substrate from which the second cover is formed.

In an embodiment shown in FIG. 6, second circuit board 52 is replaced by forming second cover 14 from an electrically insulating material such as plastic, resin, or other similar material that can be cast, injected, poured, layered or otherwise applied to the components of second electronic circuit 50 and fixed to form second cover 14 and to hold components of second electronic circuit 50 in a functional relationship. This technique can also be used to build up such material around selected components of second electronic circuit 50 to help protect the components of second electronic circuit 50 from incidental damage that may be occasioned by the assembly or disassembly of second cover 14 and camera body 45 during assembly and recycling. Further, as is shown in FIG. 6, it will be appreciated that second electronic circuit 50 can comprise components such as a sensor 104 and that second cover 14 can be defined so as to provide a chamber 106 that admits light from second cover 14 so that sensor 104 can detect light conditions and can control, for example, a quenching of flash discharge from camera 10.

Figure 7:
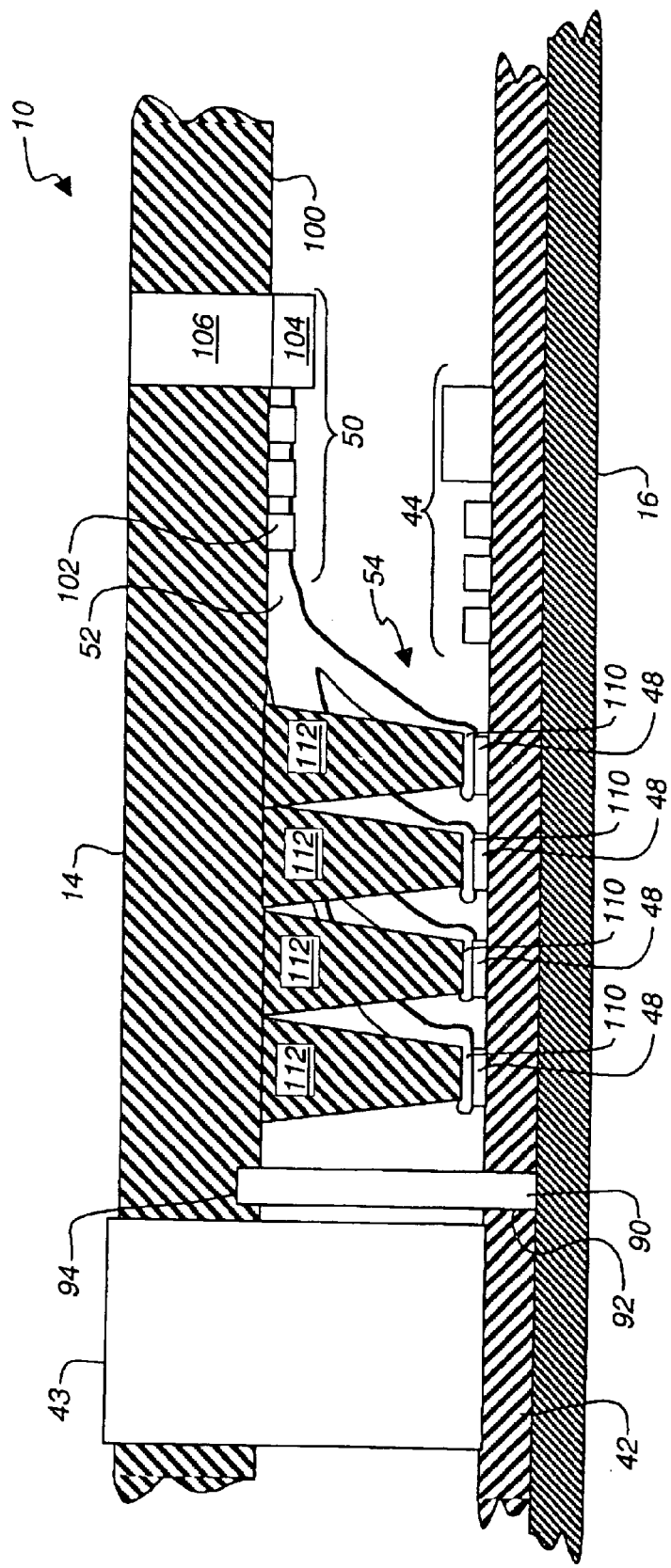
FIG. 7 shows an embodiment of a camera having a second cover with a flexible circuit fixed thereto.

As shown in FIG. 7, second circuit board 52 can comprise a flexible board. In the embodiment shown in FIG. 7, a flexible board comprises a pattern of elastically deformable portions 110 that are used to define the second set electrical contacts 54. These elastically deformable portions 110 are pressed into contact with the first set of electrical contacts 48 by a set of pegs 112. In this embodiment, pegs 112 are shown as being integrally formed as part of second cover 14. However, it will be appreciated that pegs 112 can be applied after manufacture. Further, it will be appreciated that pegs 112 can be removably applied from the outside of camera 10 so that a user or manufacturer or recycler can selectively disable certain contacts in order to modify the set of functions that camera 10 is capable of performing.

Figure 8:
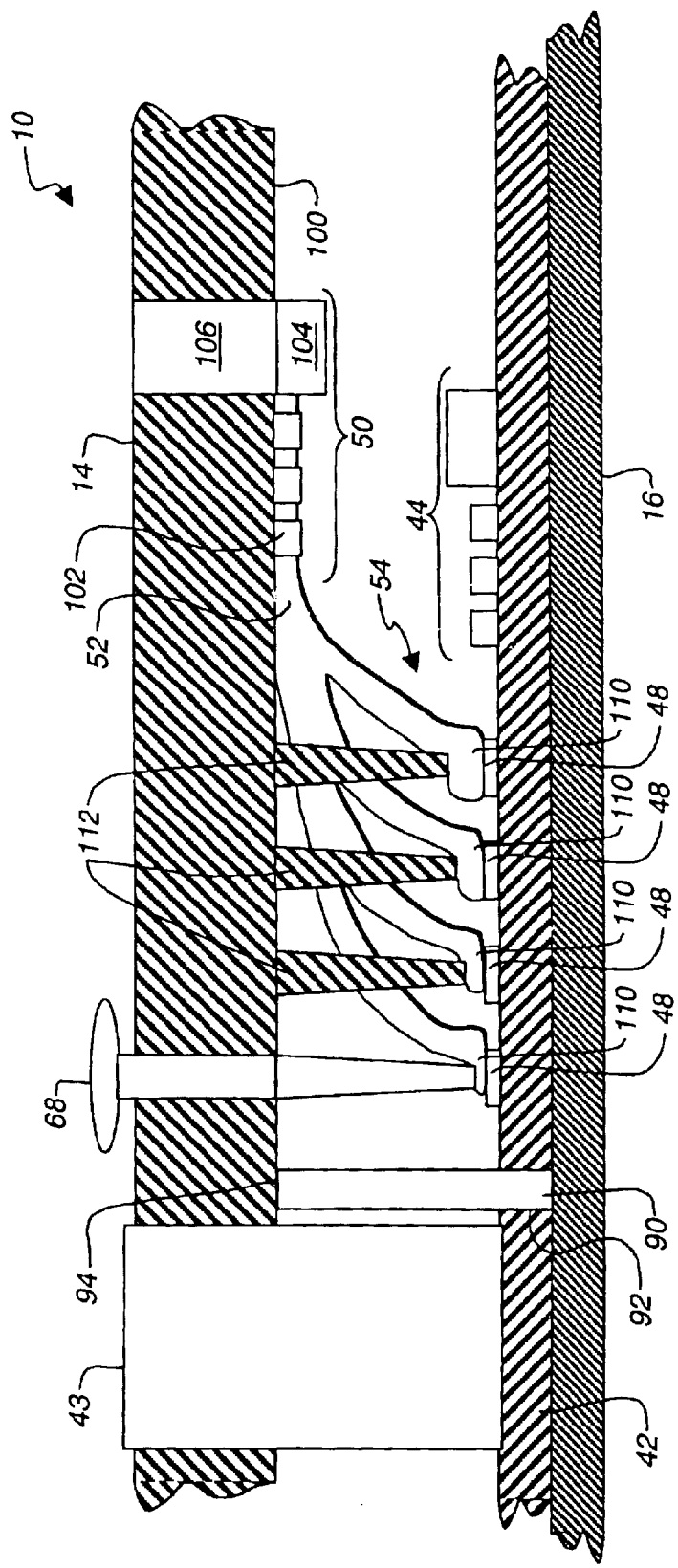
FIG. 8 shows an embodiment of a camera having a second cover with a flexible circuit fixed thereto and a movable driving member driving one of a set of second set of electrical contacts into engagement with one of a first set of electrical contacts.
Figure 9:
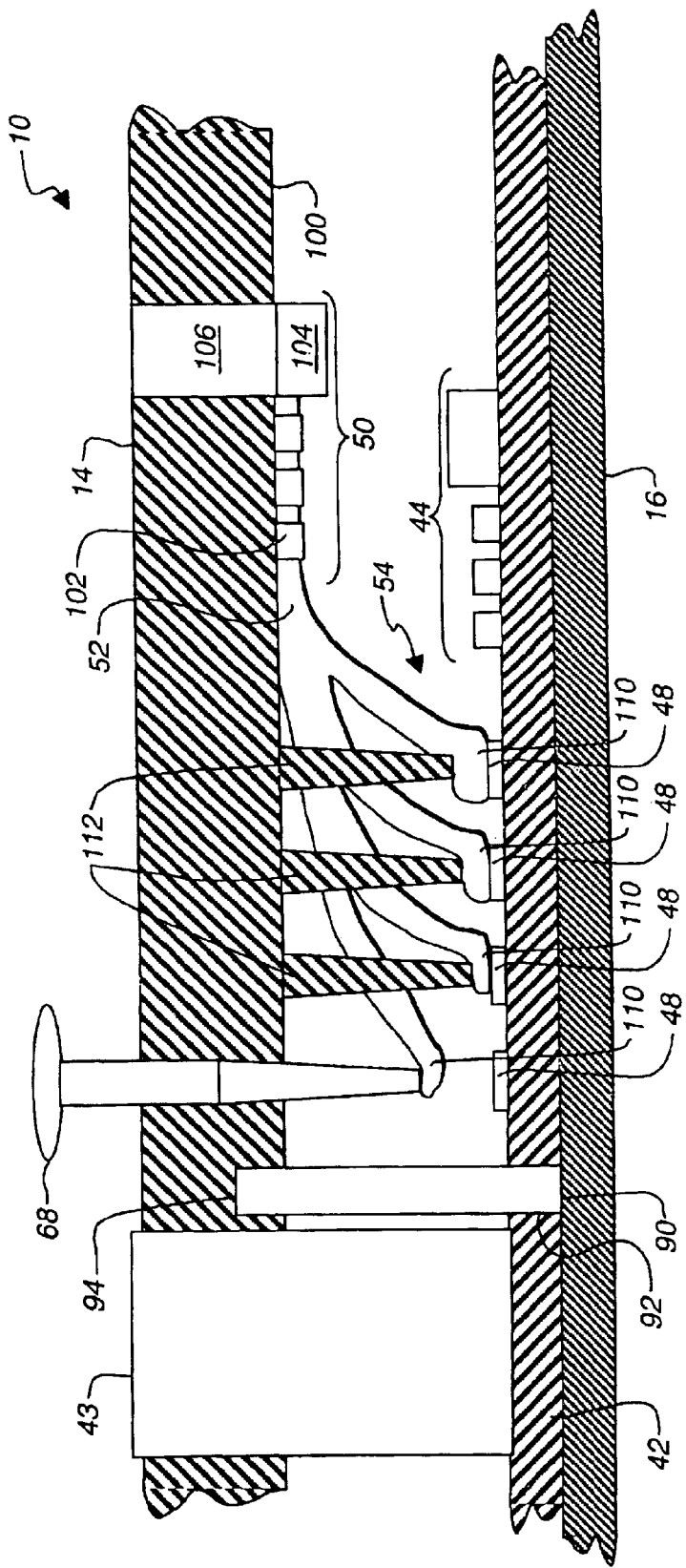
FIG. 9 shows the embodiment of FIG. 8 with the movable driving member positioned to allow one of a set of second set of electrical contacts to move out of engagement with one of a first set of electrical contacts.

As is shown in FIGS. 8 and 9, driving member 68 can be provided to permit selective engagement of a particular one of the first set of electrical contacts 48 with a particular one of the second set of electrical contacts 54. This capability can be used to selectively activate a particular one of the functions that the combined circuit is capable of performing. Such a feature can also be used to selectively cause camera 10 to perform the first set of camera functions or the second set of camera functions.

Figure 10:
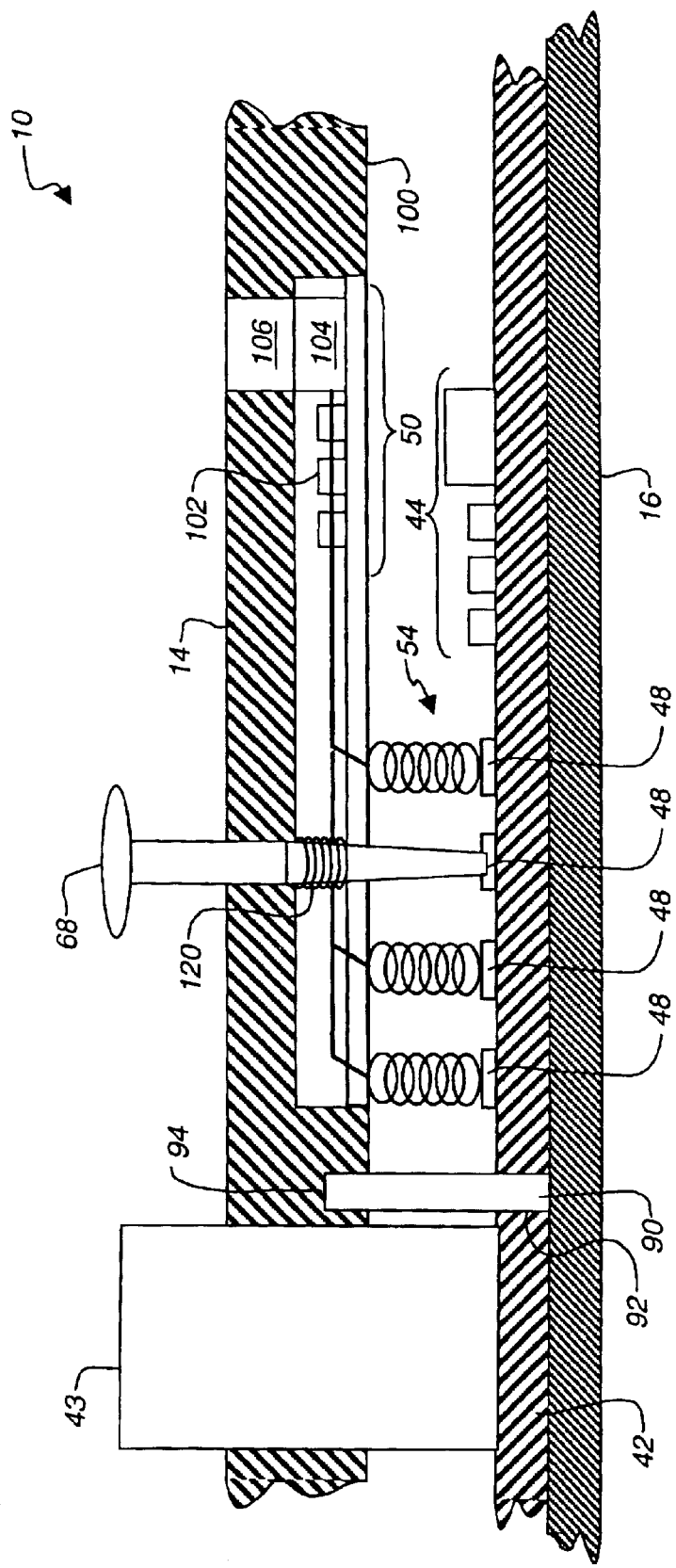
FIG. 10 shows an embodiment of a camera having a second cover and a movable driving member comprising one of a second set of electrical contacts and with said driving member positioned to engage one of a first set of electrical contacts.
Figure 11:
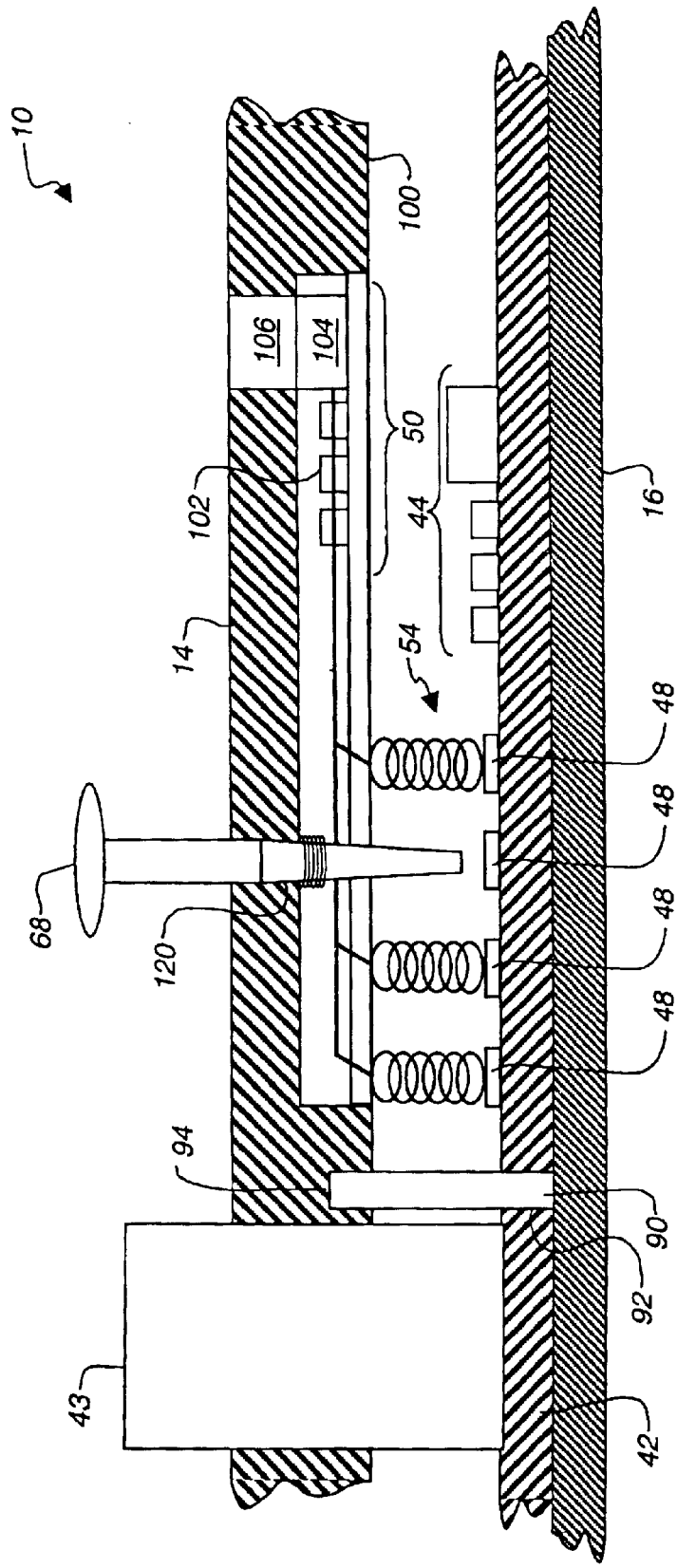
FIG. 11 shows the embodiment of FIG. 10 with said driving member positioned apart from one of a first set of electrical contacts.

In the embodiment shown in FIGS. 10 and 11, driving member 68 is provided that is at least in part, electrically conductive. Thus, driving member 68 is incorporated into second electronic circuit 50 so that when driving member 68 is in the position shown in FIG. 10, driving member 68 engages at least one of the first set of electrical contacts 48 to complete an electrical circuit between the first electronic circuit 40 and the second electronic circuit 50. This permits a user of camera 10 to selectively enable or disable at least one of the second set or first set of camera functions to selectively cause camera 10 to perform the first set of camera functions or the second set of camera functions. In the embodiment shown, driving member 68 is biased by a resilient member 120 which biases the driving member 68 into the position that is separated from the first set of electrical contacts 48. This can be used to cause a particular camera feature to be in a normally off state.

Figure 12:
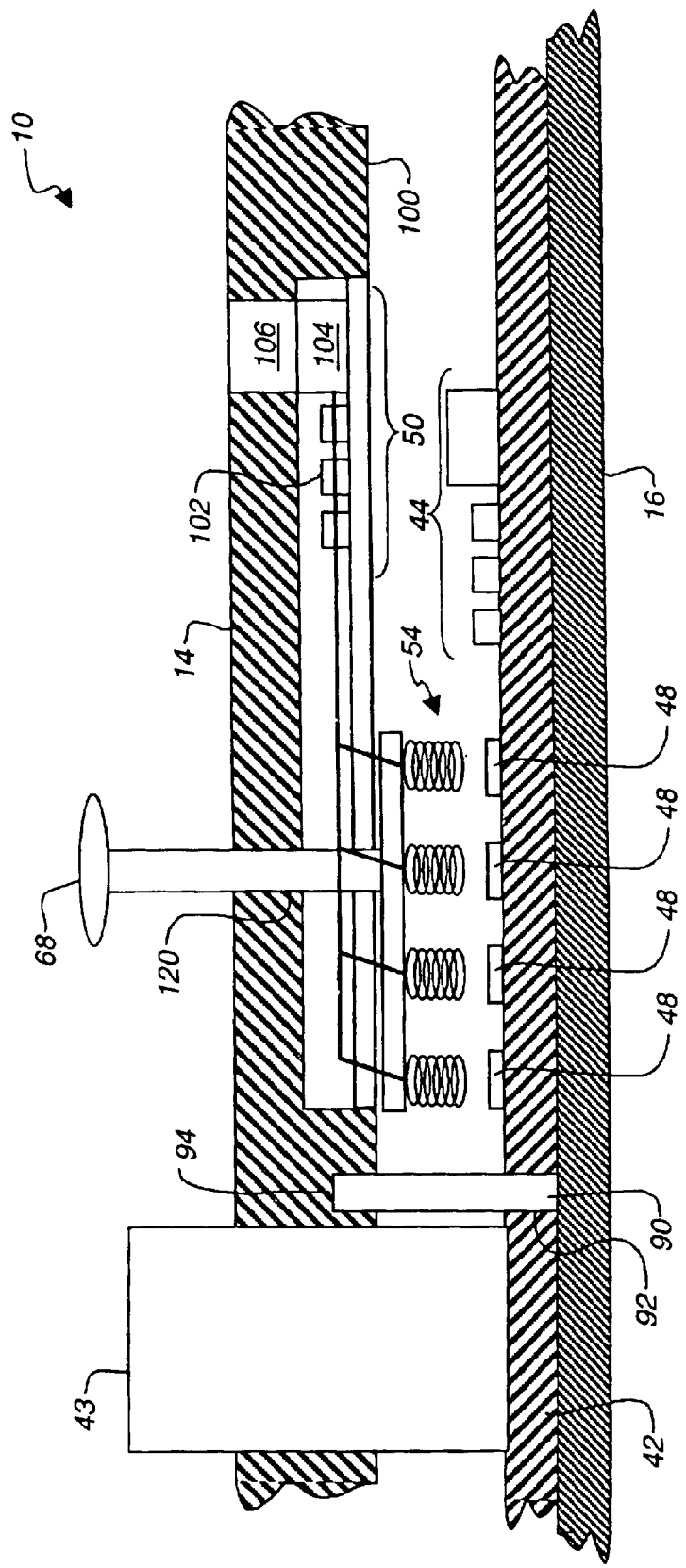
FIG. 12 shows an embodiment of a camera having a second cover and a movable driving member positioning a second set of electrical contacts and with said driving member positioned so that the second set of electrical contacts engage the first set of electrical contacts.
Figure 13:
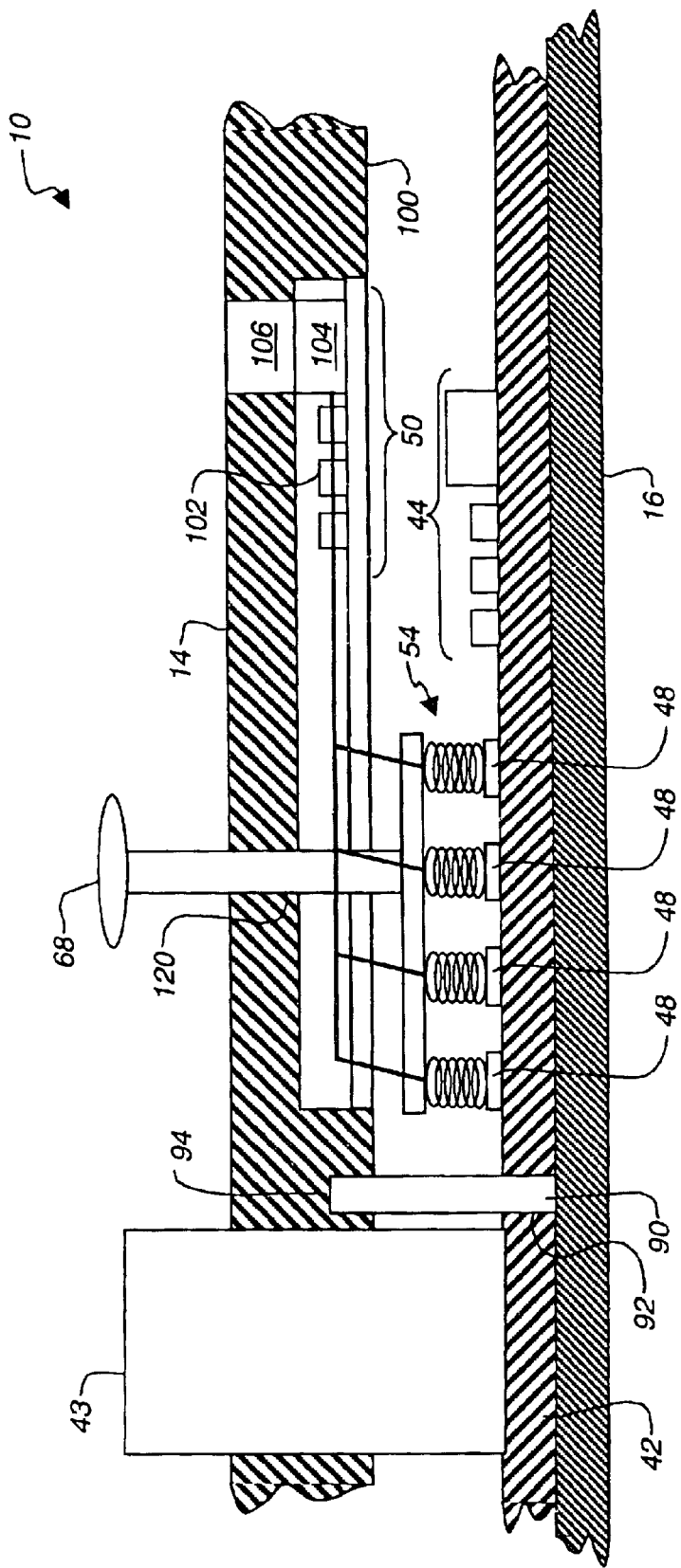
FIG. 13 shows the embodiment of FIG. 12 with said driving member positioned so that the second set of electrical contacts are separated from the first set of electrical contacts.

In an embodiment shown in FIGS. 12 and 13, driving member 68 is connected to each of the second set of electrical contacts 54 so that it can selectively move all of the second set of electrical contacts 54 from a position shown in FIG. 12 and wherein the second set of electrical contacts 54 cannot engage the first set of electrical contacts 48 to a position shown in FIG. 13 wherein the first set of electrical contacts 48 and second set of electrical contacts 54 are engaged. In this way, when the driving member 68 is positioned in the position shown in FIG. 12, camera 10 is capable of performing the first set of camera functions. However, when driving member 68 is in the position shown in FIG. 13, camera 10 can perform the second set of camera functions.

Figure 14:
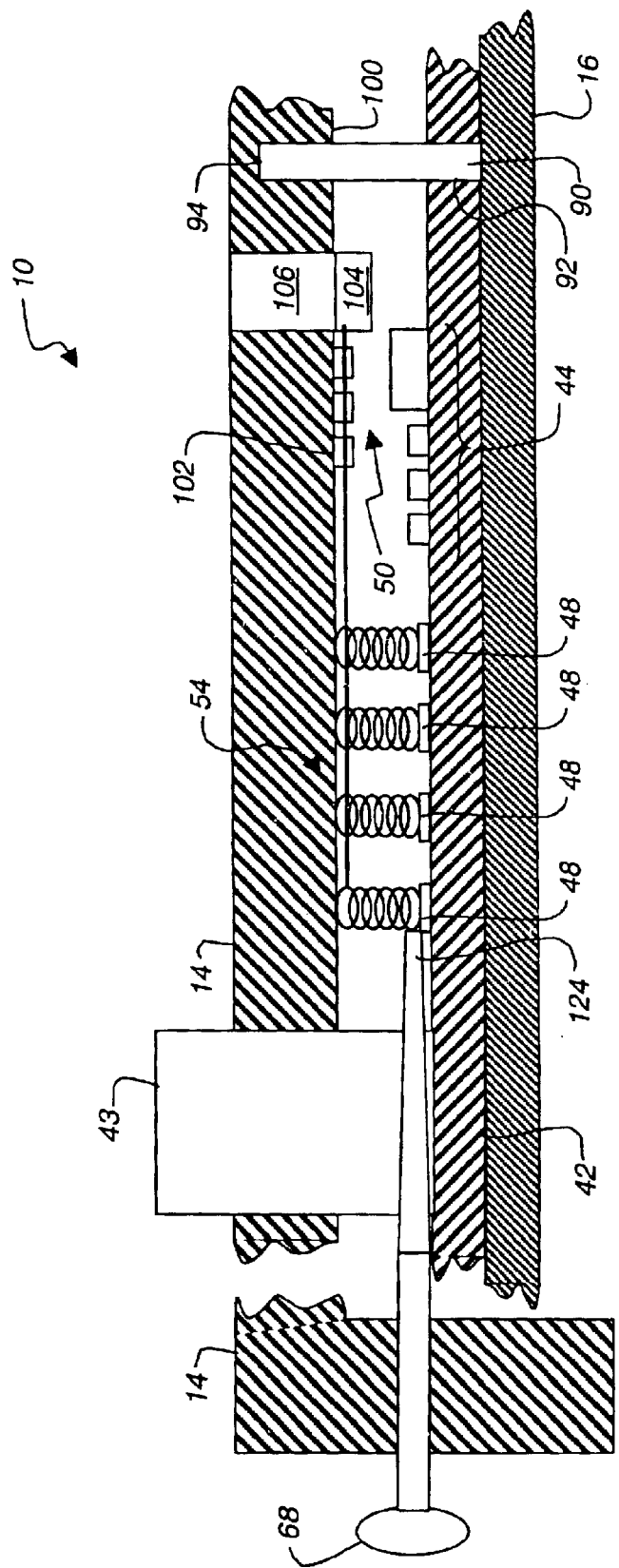
FIG. 14 shows an embodiment of a camera having a driving member that selectively positions an electrical insulator with the electrical insulator positioned apart from a first and a second set of electrical contacts.
Figure 15:
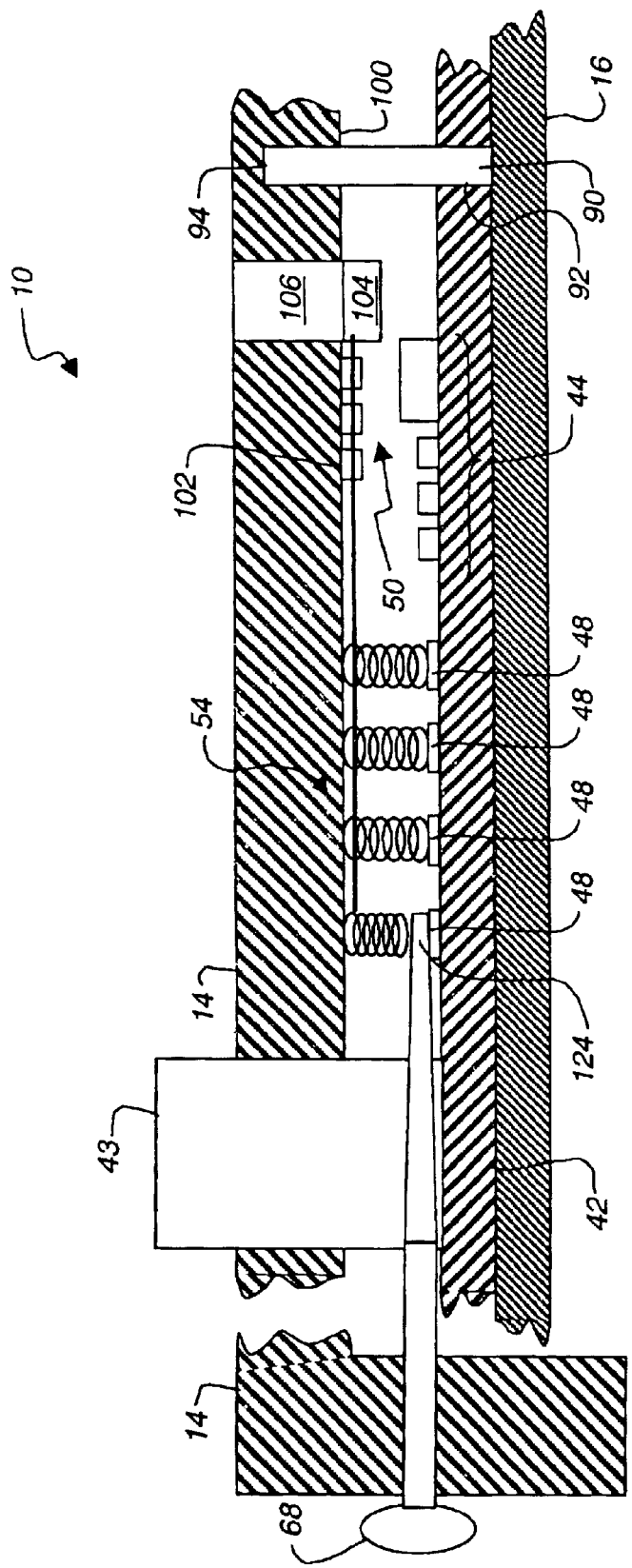
FIG. 15 shows the embodiment of FIG. 14 with the insulator positioned between at least one of the contacts of the first set of electrical contacts and one of the contacts of the second set of electrical contacts.

In another embodiment of the present invention, shown in FIGS. 14 and 15, driving member 68 is supplied which has an electrical insulator 124. Driving member 68 is movable between a first position shown in FIG. 14 and a second position shown in FIG. 15. In the position shown in FIG. 14, each of the electrical conductors can engage each of the contacts of the second set of electrical contacts 54. However, when driving member 68 is moved to the second position, electrical insulator 124 is inserted to separate at least one of the contacts of the first set of electrical contacts 48 from at least one of the contacts of the second set of electrical contacts 54. In this way, selected functions of camera 10 can be selectively enabled or disabled by the user.

Figure 16:
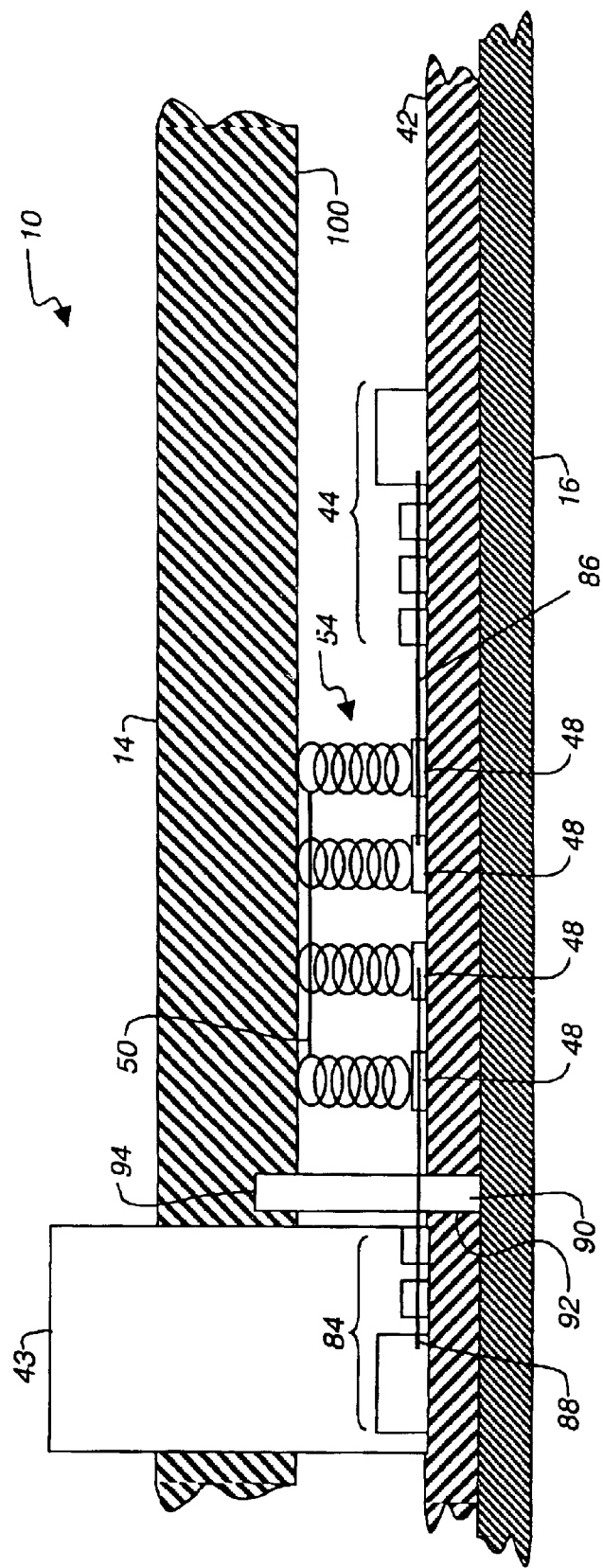
FIG. 16 shows the use of a cover having a second electronic circuit that joins the contact of a first electronic circuit with the contacts of an additional circuit.

It will be appreciated that there may be circumstances where it may be preferable to incorporate one or more additional electronic circuit 84 onto a frame 16. This can be done, for example, where it is more convenient or less costly to build electronic circuits into camera body 45 while reducing the complexity or cost of second cover 14 low. In such an embodiment, the second electronic circuit 50 can comprise a connecting circuit that enables the first electronic circuit 44 to cooperate with the additional electronic circuit 84. An example of this is shown in FIG. 16 wherein the second electronic circuit 50 defines an electrical path between bus path 86 of the first electronic circuit 44 and bus path 88 of the additional electronic circuit 84. Alternatively, second electronic circuit 50 can comprise components and circuitry cooperate with both of the first electronic circuit 44 and the additional electronic circuit 84 to perform additional camera functions. In like fashion, first electronic circuit 44 can be defined with components that are capable of performing a first set of camera functions that are selectably enabled when an electrical connection is made between selected pairs of the first set of electrical contacts 48. In such an embodiment the second electronic circuit 50 can provide electrical pathways to join one or more of the selected pairs to enable one or more of the first set of camera functions.

Turning now to FIGS. 17–20, what is shown are schematic diagrams and embodiments of various flash circuits having different sets of functions that can be usefully incorporated into camera 10 as shown and described above. It will be appreciated that while these embodiments depict the camera flash circuits, other types of circuits having different sets of functions are contemplated and can be executed in like fashion.

Figure 17:
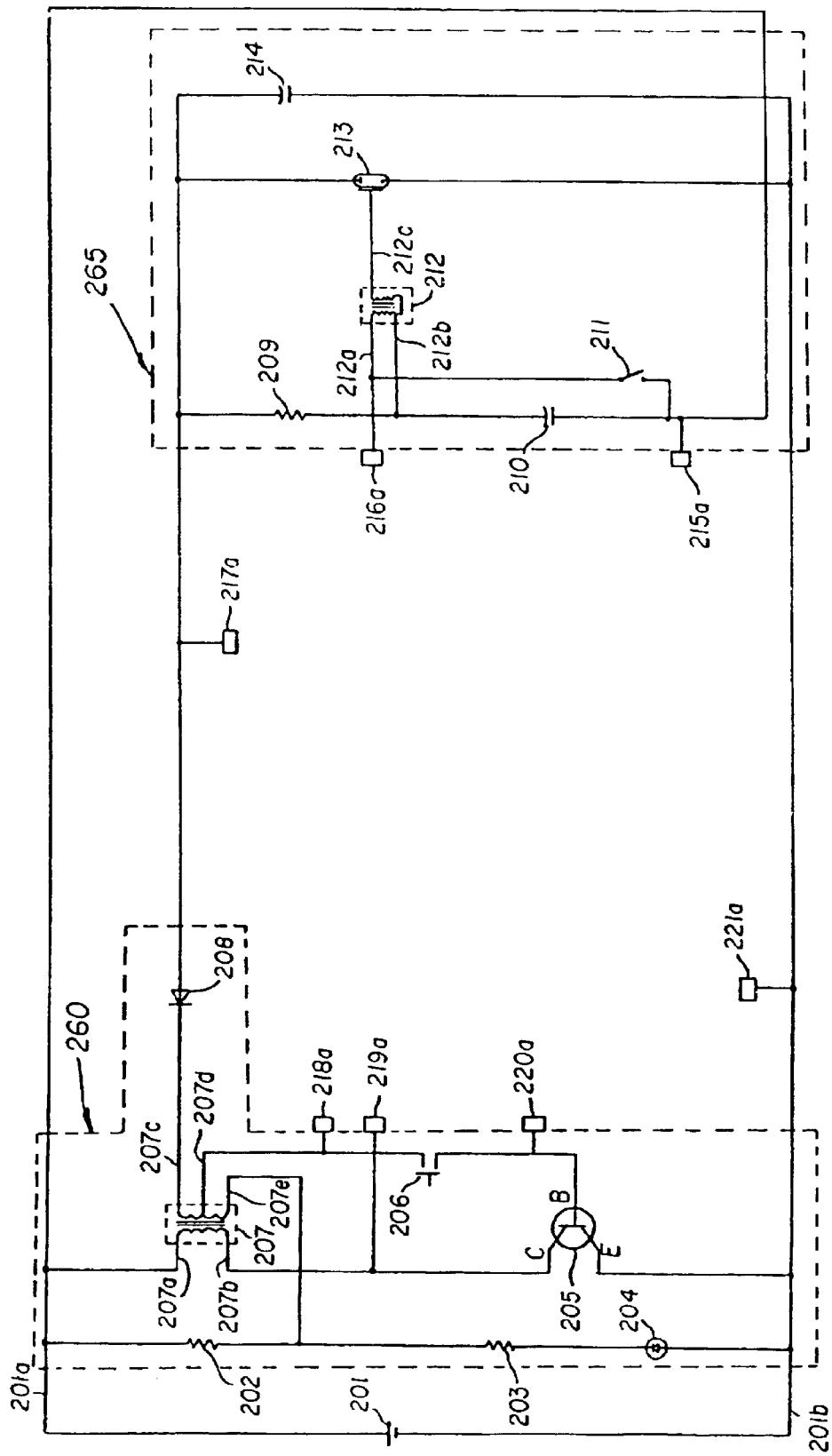
FIG. 17 shows a first circuit for performing a first set of camera functions and having a first set of electrical contacts.

FIG. 17 shows a detailed embodiment of a first electronic circuit 44 comprising a flash circuit 200 for use in providing a press and hold type camera flash. Flash circuit 200 incorporates a power source 201 which can be, for example, a 1.5 volt battery cell. The flash circuit 200 includes a self-oscillating flash charging circuit 260, and a flash illumination circuit 265. Flash charging circuit 260 comprises an oscillating transistor 205, step-up oscillating transformer 207, rectifier diode 208, LED ready light 204. A manually operated, normally open push button switch 206, is operated by, for example, driving member 68 as is generally described above. When closed, push button switch 206 causes flash charging circuit 260 to store electrical energy in flash energy capacitor 214. The customer presses push button switch 206 and holds it closed until the LED ready light 204 illuminates to indicate that flash energy capacitor 214 is charged to flash ready voltage. The customer then repeats this procedure for the next picture.

Flash illumination circuit 265 comprises trigger capacitor 210, shutter sync switch 211, trigger transformer 212, flash tube 213, and flash energy capacitor 214. Shutter sync switch 211 typically is interconnected with camera shutter system 36 so as to be closed momentarily when the shutter system is opened by pressing the camera shutter release 38. The closure of shutter sync switch 211 enables flash energy to be discharged from flash energy capacitor 214 into flash tube 213 causing a flash of light to emit from flash tube 213.

Also shown in FIG. 17 are contacts 215a–221a. These contacts provide electrical connection points at strategic locations within the camera flash circuit 200. As discussed above, contacts 215a–221a are provided so that they can be engaged by an embodiment of second electronic circuit 252 to cause the combined flash circuit 200 and second embodiment of electronic circuit 252 to perform a desired set of functions.

Figure 18:
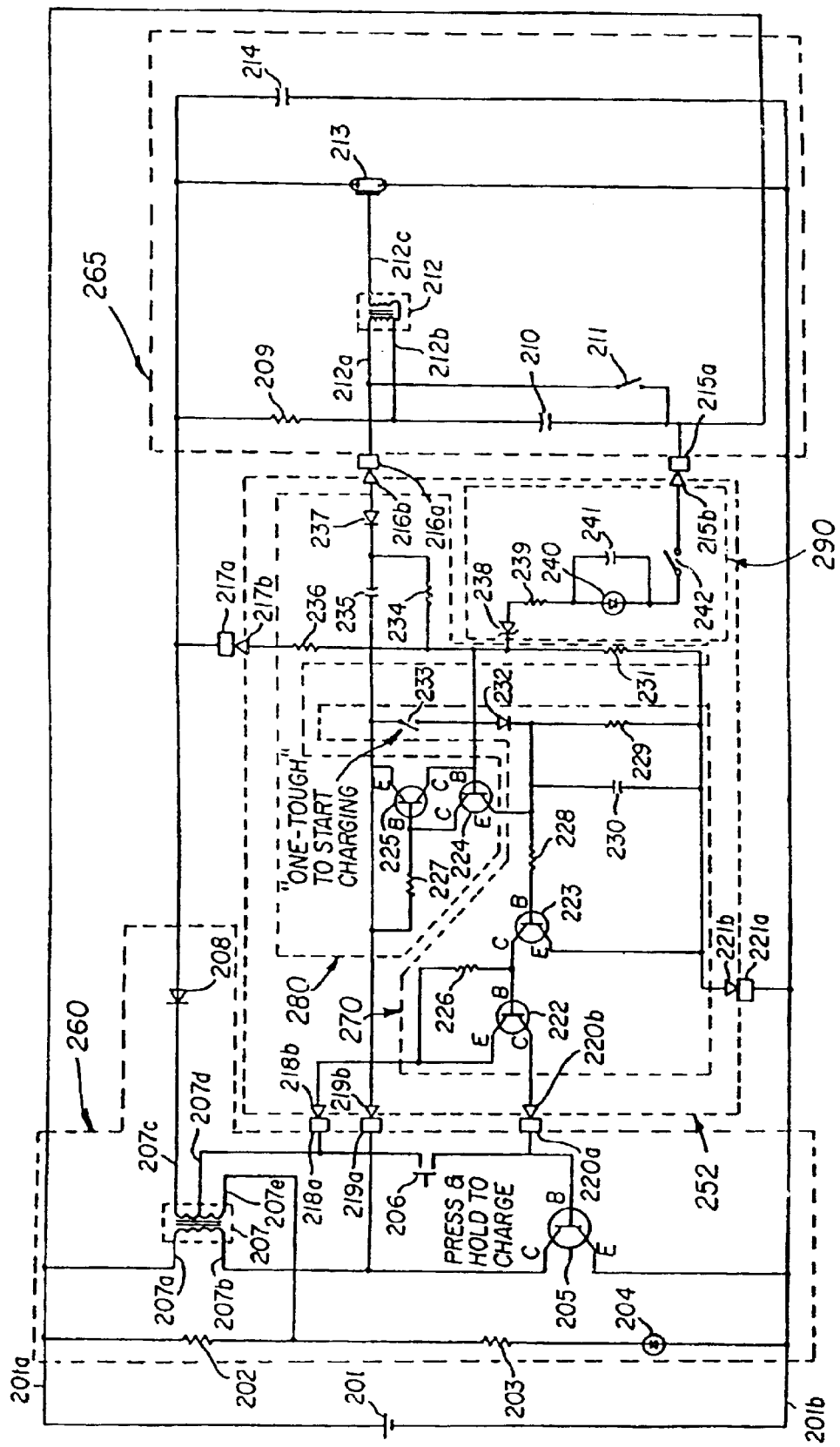
FIG. 18 shows the embodiment of FIG. 17 in combination with one embodiment of a second circuit with said combination performing a second set of camera functions.

The embodiment of FIG. 18 shows an embodiment of a second electronic circuit 252 having second contacts 215b–221b that engage respectively contacts 215a–221a to interconnect the operation of flash circuit 200 and second electronic circuit 252. Second electronic circuit 252 contains a timeout circuit 270, an auto-restart circuit 280 and a fatbit recording circuit 290. Timeout circuit 270 includes transistors 222 and 223, timing capacitor 230 and "one-touch" push button switch 233 and diode 232. Auto-restart circuit 280 includes transistors 224, 225, diode 237 and capacitor 235. Fatbit recording circuit 290 includes fatbit recording LED 240, fatbit selection switch 242, zener diode 238 and capacitor 241.

The operation of the flash circuit 200 in conjunction with second electronic circuit 252 will be described. It will be recalled that flash circuit 200 operates in the "press and hold" mode when push button switch 206 is closed. This switch must be functionally disabled in order to permit flash circuit 200 to operate in a different manner. In this regard, second cover 14 prevents the user of camera 10 from engaging this dome switch. Advantageously, "one-touch" push button switch 233 is located in second electronic circuit 50 and located for engagement by, for example, a driving member 68 as is shown above. Thus, driving member 68 can be used to cause flash circuit 200 to activate the "press and hold" mode when second electronic circuit 252 is not present or to cause second electronic circuit 252 to enter the "one touch" mode when second electronic circuit 252 is present.

When button switch 233 on second electronic circuit 252 is pressed, a forward bias is applied to diode 232 and transistors 222 and 223. This turns transistor 222 and 223 on. With transistor 222 turned on, current flows from the battery 201a through resistor 202 to oscillating transformer 207 to feedback winding 207e–d of oscillating transformer 207 to transistor 222 emitter-collector to the base of transistor 205. Thus oscillating transistor 205 turns on and conducts battery current through the primary winding 207a–b of oscillating transformer 207, initiating oscillatory pulses through primary winding 207a–b. The voltage of these pulses is stepped up in the secondary winding 207c–d and rectified by diode 208 to charge main flash energy capacitor 214. Diode 232 rectifies pulses from the primary winding 207b to continue charging timing capacitor 230 while button switch 233 is closed. Typically, timing capacitor 230 is charged in about 10 milliseconds and discharges over 30 seconds. Flash energy capacitor 214 charges to flash ready voltage in about 5 seconds.

The DC bias to continue the oscillation and thus continue flash charging after button switch 233 is open is provided by timing capacitor 230, which charges positive when button switch 233 is closed. When button switch 233 opens, timing capacitor 230 slowly discharges through resistor 228 and the base-emitter of transistor 223, keeping transistors 223 and 222 turned on for about 30 seconds. This, in turn, keeps the oscillation on for this period. Resistor 229 insures that timing capacitor 230 will eventually discharge completely, thus insuring that the charging will turn off after the timeout period.

A light emitting diode (LED) ready light is connected from the oscillating transformer 207 feedback winding 207e–d to battery negative 201b. As the flash energy capacitor 214 charges and increases its voltage, the voltage of the pulses at feedback winding 207e simultaneously increase in proportion to the flash capacitor 214 voltage. The transformer winding ratio of 207c–d to 207d–e is chosen so that when flash energy capacitor 214 reaches flash ready voltage (about 270 volts), the LED ready light 204 will illuminate and indicate that the camera is ready to take a flash picture.

Trigger capacitor 210 is charged by current flow through secondary winding 207c–d at the same time and in a similar manner as flash energy capacitor 214. When shutter sync switch 211 is closed at the start of a picture taking sequence, terminal 212 a of trigger transformer 212, which is at the negative charge potential of flash energy capacitor 214, is pulled momentarily to the positive battery potential, 201a. Trigger capacitor 210 then discharges through the primary winding of trigger transformer 212, inducing a very high voltage pulse in the secondary winding 212c, which is applied to the triggering electrode T of flash tube 213. This causes ionization of the gas in the flash tube 213 resulting in flash energy capacitor 214 discharging through flash tube 213, producing flash illumination. Resistor 209 provides isolation between the flash tube discharge circuit and the flash tube trigger circuit, preventing flash energy capacitor 214 from discharging into the primary of trigger transformer 212.

The closure of shutter sync switch 211 also initiates the restart of oscillation in the flash charging circuit 260, automatically recharging flash energy capacitor 214 for the next picture. Closing shutter sync switch 211 causes the normally reverse biased diode 237 to become forward biased by the connection of its anode through the closed contacts of shutter sync switch 211 to the positive battery potential 201a. This action draws current through resistor 234 and the base-emitter junction of transistor 224, turning it on. Transistors 224 and 225 have their bases and collectors connected to form a thyristor; hence when 224 is turned on, it in turn turns on 225 and the transistors "lock" keeping each other turned on. Current then flows from primary winding 207b through transistors 224 and 225 to charge timing capacitor 230 and restart the flash charging sequence. Capacitor 235 charges when diode 237 conducts. The charge on capacitor 235 keeps transistors 224 and 225 turned on for a period of time sufficient to charge timing capacitor 230; otherwise transistors 224 and 225 would turn off when shutter sync switch 211 opens and diode 237 stops conducting. Transistors 224 and 225 turn off when the charge on capacitor 235 is depleted and current from this charge no longer forward biases the base of transistor 224 on.

In addition, as timing capacitor 230 charges, it makes the emitter of transistor 224 more positive with respect to the base, enhancing the turnoff of transistor 224. Resistor 236 couples voltage from flash energy capacitor 214 into the base of transistor 224. As the flash energy capacitor 214 charges, resistor 236 provides an increasing negative bias to the base of transistor 224, further enhancing turn-off of transistors 224 and 225. The turnoff is defined so that the charging of the timing capacitor 230 stops at a predefined fully charged level.

Second electronic circuit 252 also comprises a fatbit recording circuit 290. "Fatbit" is a term used to describe optically recorded metadata recorded on a film by a one time use camera. When a fatbit is detected during photofinishing, the photofinisher knows to print the image using, for example, a panoramic aspect ratio, to execute digital zoom or to perform some other type of special image processing procedure. Essentially the fatbit recorder comprises a light emitting diode that exposes a predefined non-image portion of the image recorded on the film.

Fatbit recording circuit 290 works as follows: capacitor 235 is charged during closure of shutter synch switch 211 and provides positive bias to the base of transistor 224 for a time period greater than the period for which shutter synch switch 211 is closed, keeping transistors 224 and 225 on for this period. Transistor 225 provides a current path for positive pulses from the oscillation transformer 207b and this becomes the energy source for illuminating fatbit recording fatbit recording LED 240. The illuminating current flows from transistor 225 collector, zener diode 238, current limiting resistor 239, LED 240 and data recording on-off switch 242 to positive battery potential 201a. The voltage of zener diode 238 is chosen so that it will not conduct when button switch 233 is closed and thus no data recording will be made when switch 233 is pressed to initiate flash charging. Data recording will only take place when shutter sync switch 211 is closed during a picture taking sequence and when fatbit selection recording switch 242 is closed.

Figure 19:
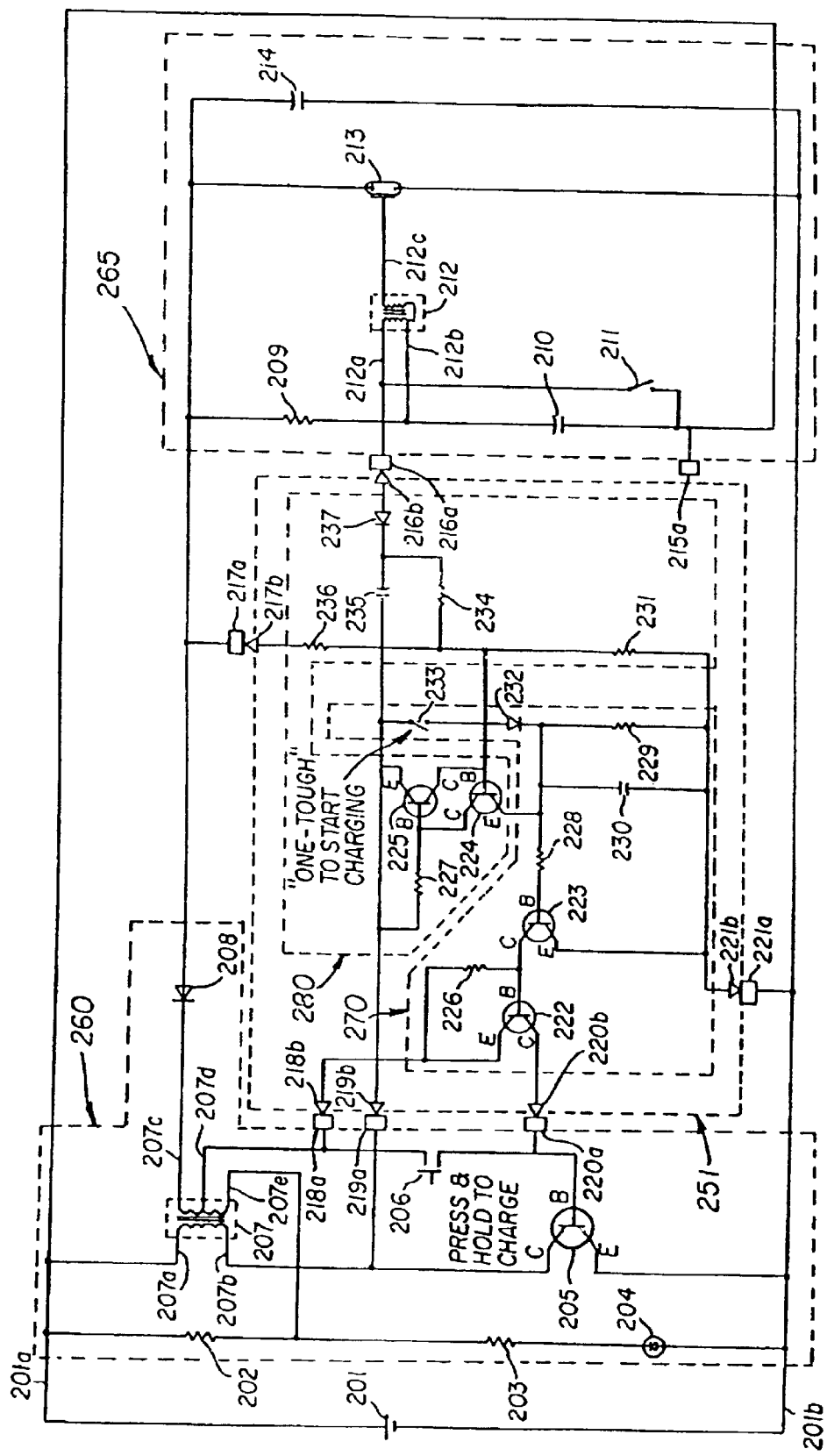
FIG. 19 shows the embodiment of FIG. 17 with another embodiment of a second circuit that cooperates with the first circuit to perform a third set of camera functions.
Figure 20:
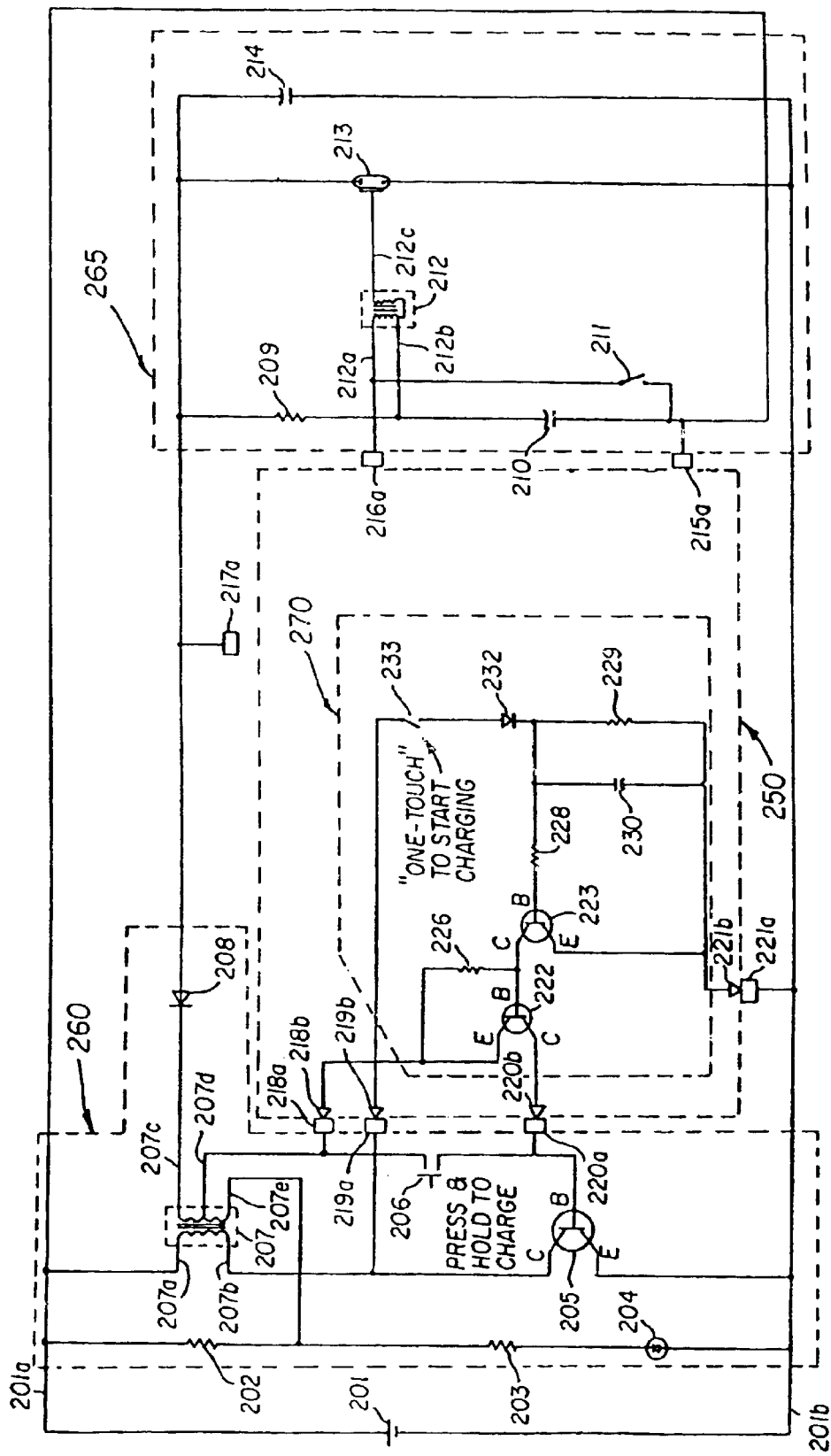
FIG. 20 shows an embodiment of flash circuit of FIG. 17 with still another embodiment of a second circuit that cooperates with the first circuit to perform a fourth set of camera functions.

FIGS. 19 and 20 show alternate embodiments of second electronic circuits 251 and 250 respectively that can be used in conjunction with flash circuit 200 shown in FIG. 17 to perform, respectively, a third set of camera functions and a fourth set of camera functions.

FIG. 19 shows another embodiment of a circuit for use in a flash camera having one touch charging that automatically restarts after charging. In this embodiment, flash circuit 200 is combined with an embodiment of a second electronic circuit 251 having a one touch charging circuit, a timeout circuit 270, and an auto-restart circuit 280. These circuits combine in the manner described above to provide a circuit that executes one touch charging and that restarts the charging process immediately after discharge of a flash light.

FIG. 20 shows flash circuit 200 in conjunction with another embodiment of a second electronic circuit 250 which provides "one-touch" operation of the charger. Second electronic circuit 250 is a circuit that converts the operation of the flash charging system so that the user does not have to press and hold push button switch 206 closed in order to permit the charger to charge flash energy capacitor 214. Instead, by combining flash circuit 200 of FIG. 17 with one touch circuit 250, a circuit is provided that permits the user to close button switch 233 only once to initiate a charge flash cycle, and then permits the user to open button switch 233 without interrupting the charging process. This combination circuit is further adapted to shut off the charging process when the appropriate charge is placed across flash energy capacitor 214. The user presses and immediately releases button switch 233 to initiate flash charging for about 30 seconds. The customer repeats this procedure for the next picture.

In accordance with the present invention, a family of cameras 10 can be provided each of which uses a camera body 45 having a first electronic circuit 44 and different types of second cover 14. For example, as is shown in FIGS. 21a–21c, a family of cameras 10a, 10b, 10c, respectively, are provided that each use the same camera body 45. In the embodiment shown camera body 45 used in FIGS. 21a, 21b and 21c, has a first electronic circuit 44 comprising a flash circuit 200 of the type shown above and described with respect to FIGS. 17–20.

In the example shown in FIG. 21a, camera body 45 incorporates a flash circuit 200 described above, while cover 14a has a second electronic circuit such as second electronic circuit 250 described above and that combines with flash circuit 200 to provide a camera 10a that performs one touch charging.

In the example shown in FIG. 21b, camera body 45 incorporates a flash circuit 200 described above, while second cover 14c has a second electronic circuit 251 having a timeout circuit 270, and an auto-restart circuit 280 as described above. When cover 14b is joined to camera body 45 a camera 10b is formed having a one touch charging with auto-restart, and automatic time out functions.

In the example shown in FIG. 21c, camera body 45 incorporates a flash circuit 200 described above, while second cover 14c has a second electronic circuit 252 having a timeout circuit 270, an auto-restart circuit 280 and a fatbit recording circuit 290 as described above. When second cover 14b is joined to camera body 45 a camera 10b is formed having a one touch charging with auto-restart, timeout and fatbit recording functions.

Figure 22:
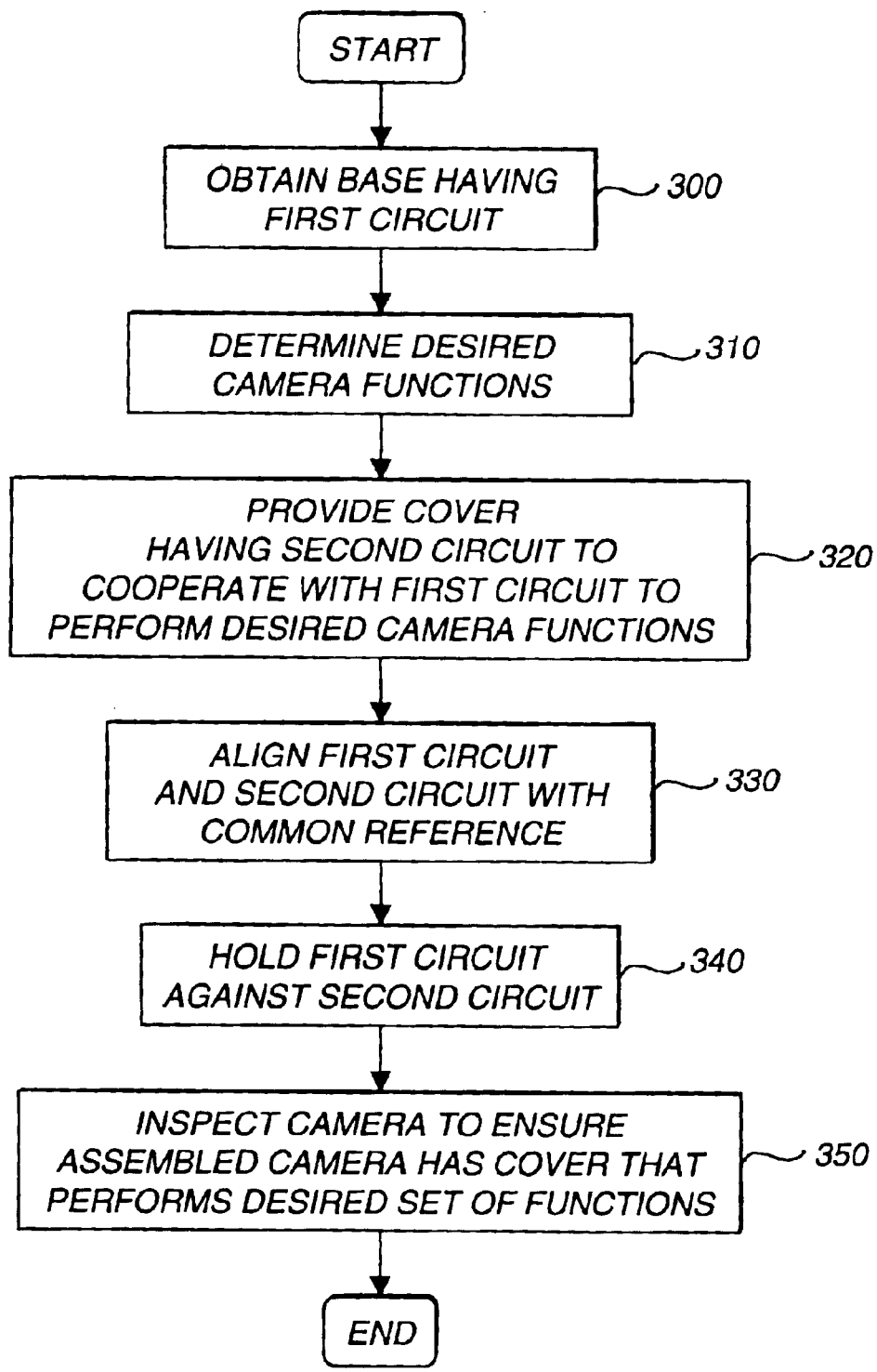
FIG. 22 shows a method for recycling a camera of the present invention.

FIG. 22 shows a method for assembling camera 10 of the present invention. This method comprises the steps of obtaining camera body 45 having a first electronic circuit. Camera body 45 can be newly manufactured or can be taken from a previously manufactured camera. The desired set of functions that the camera is to perform are then identified. (step 310) Second cover 14 is provided having a second electronic circuit 50 that is adapted to join with the first electronic circuit 44 to perform the desired set of camera functions. (step 320) First electronic circuit 44 and the second electronic circuit 50 are aligned relative to a common reference. (step 330) This common reference can be, for example, an alignment post. The first electronic circuit and the second electronic circuit are positioned together so that they can cooperate. (step 340) In one embodiment, the step of positioning the first circuit and the second circuit together is performed by providing a cover that is adapted to press the second electronic circuit against the first electronic circuit when the cover is joined to the frame.

After the second cover is joined to camera body 45, second cover 14 is tested to verify that the camera is capable of performing the desired set of functions. (step 350) Preferably, this is done using automated processes to detect distinguishing features of second cover 14. For example, in the family of cameras shown in FIGS. 21*a*–21*c*, the shape of second cover 14 can be used to identify the functions that camera 10 having the respective second cover 14 is capable of performing. Alternatively the placement of structures such as driving member 68 can be used to identify the functions that the camera is capable of performing. Thus, in this embodiment, each type of second electronic circuit 50 is uniquely associated with second cover 14 having a distinguishing set of features. The distinguishing features of second cover 14 can be identified externally thus providing external identification of the functions that the camera electronic system 40 of camera 10 can perform.

The invention has been described in detail with particular reference to certain one embodiments thereof, but it will be understood that variations and modifications can be effected within the spirit and scope of the invention.

PARTS LIST

| | |
|---|---|
| 10 | camera |
| 12 | first cover |
| 14 | second cover |
| 16 | frame |
| 17 | filmpath |
| 18 | film take-up reel area |
| 19 | supply spool area |
| 20 | supply spool |
| 22 | film |
| 24 | take-up reel |
| 28 | image capture area |
| 30 | opening |
| 32 | lens |
| 34 | scene |
| 34' | image of scene |
| 36 | shutter system |
| 38 | shutter release |
| 39 | shutter blade |
| 40 | camera electronic system |
| 42 | first circuit board |
| 43 | flash tube |
| 44 | first electronic circuit |
| 45 | camera body |
| 46 | dome switch |
| 48 | first set of electrical contacts |
| 49 | opening |
| 50 | second electronic circuit |
| 52 | second circuit board |
| 54 | second set of electrical contacts |
| 56 | switch |
| 57 | synchronization switch |
| 68 | driving member |
| 69 | port |
| 70 | mounting |
| 80 | cover mating surfaces |
| 82 | body mating surfaces |
| 84 | additional electronic circuit |
| 86 | bus path |
| 88 | bus path |
| 90 | alignment post |
| 91 | perimeter |
| 92 | passageway |
| 94 | aperture |
| 96 | tapered portion |
| 98 | end |
| 100 | inner surface |
| 102 | components |
| 104 | sensor |
| 106 | chamber |
| 110 | elastically deformable portion |

-continued

PARTS LIST

| | |
|---|---|
| 112 | pegs |
| 120 | resilient member |
| 124 | electrical insulator |
| 200 | flash circuit |
| 201 | power source |
| 201a | battery positive |
| 201b | battery negative |
| 202 | resistor |
| 204 | LED ready light |
| 205 | oscillating transistor |
| 206 | push button switch |
| 207 | oscillating transformer |
| 208 | rectifier diode |
| 209 | Resistor |
| 210 | trigger capacitor |
| 211 | shutter sync switch |
| 212 | trigger transformer |
| 213 | flash tube |
| 214 | flash energy capacitor |
| 222 | transistor |
| 223 | transistor |
| 224 | transistor |
| 225 | transistor |
| 228 | resistor |
| 229 | resistor |
| 230 | timing capacitor |
| 232 | diode |
| 233 | button switch |
| 234 | resistor |
| 235 | capacitor |
| 236 | resistor |
| 237 | diode |
| 238 | zener diode |
| 239 | resistor |
| 240 | fatbit recording LED |
| 241 | capacitor |
| 242 | fatbit selection switch |
| 250 | embodiment of second electronic circuit |
| 251 | embodiment of second electronic circuit |
| 252 | embodiment of second electronic circuit |
| 260 | flash charging circuit |
| 265 | flash illumination circuit |
| 270 | time out circuit |
| 280 | auto-restart circuit |
| 290 | fatbit recording circuit |
| 300 | obtain base step |
| 310 | determine desired features step |
| 320 | provide cover step |
| 330 | alignment step |
| 340 | first and second circuits together step |
| 350 | test camera functions step |

What is claimed:

1. A camera body adapted to be joined to a cover, the cover having an outer electronic circuit with a set of electrical contacts, said contacts being positioned by the cover in relation to an aperture, the camera body comprising:

a body mating surface shaped to engage a cover mating surface on the cover to join the cover to the body in a closed position with said body mating surface and cover mating surfaces shaped to permit movement of the cover relative to the body when the cover and body are joined in the closed position;

an inner electronic circuit with a set of electrical contacts adapted to engage the electrical contacts of the outer electronic circuit and to cooperate therewith to perform a set of camera functions when the set of electrical contacts from the outer electronic circuit is held against the set of electrical contacts from the inner electronic circuit; and a post aligned with the set of electrical contacts of the inner electronic circuit, the post being adapted to engage the aperture in the cover so that as the cover is joined to the body, the set of electrical contacts from the outer electronic circuit is aligned with the set of electrical contacts from the inner electronic circuit.

2. The camera body of claim 1 comprising more than one post adapted to engage a cover having more than one aperture.

3. The camera body of claim 1, wherein the post is circular in cross section and the passageway is circular in cross section.

4. The camera body of claim 1, wherein the post has cross sectional shape that is at least one of a square, triangle, star, rectangle, or polygon.

5. The camera body of claim 1, wherein the post has a tapered portion at an end confronting the cover.

6. The camera body of claim 5, further comprising at least one additional inner circuit having at least one additional set of contacts.

7. The camera body of claim 6, wherein said at least one additional set of contacts is adapted to engage at least one of the electrical contacts of an outer electronic circuit.

8. The camera body of claim 7, wherein the inner electronic circuit and additional electronic circuit are adapted to cooperate by way of the outer electronic circuit to perform at least one camera function.

9. A camera body adapted to be joined to a cover, the cover having an outer electronic circuit board with a set of electrical contacts and an aperture; the camera body comprising:

a body mating surface shaped to engage a cover mating surface on the cover to join the cover to the body in a closed position, with cover permitting movement of the outer electronic circuit board relative to the cover;

an inner circuit board having a passageway and an inner circuit with a set of electrical contacts adapted to engage the electrical contacts of the outer electronic circuit and to cooperate therewith to perform a set of camera functions when the contacts of the inner electronic circuit are held against the electrical contacts of an outer electronic circuit; and a post adapted to engage the passageway of the inner circuit board to align the electrical contacts of the inner circuit with the post, said post further adapted to engage the aperture of an outer circuit board and to align the electrical contacts of the outer electronic circuit with the electrical contacts of the inner electronic circuit;

wherein the contacts of the outer electronic circuit are held against the contacts of the inner electronic circuit when the body is joined to such a cover.

10. The camera body of claim 9, wherein said frame defines more than one post and wherein the inner circuit board defines a passageway to engage each post and the outer circuit board defines an aperture to engage each post.

11. The camera body of claim 9, wherein the post is circular in cross section and the passageway is circular in cross section.

12. The camera body of claim 9, wherein the post has a cross sectional shape that is at least one of a square, triangle, star, rectangle, or polygon.

13. A camera comprising:

a frame having a first electronic circuit with a first set of electrical contacts with the first set of electrical contacts adapted to engage a second set of electrical contacts from a second electronic circuit and to cooperate therewith to perform a set of camera functions when said first set of contacts is held against said second set of electrical contacts;

an image capture system joined to the frame;

a cover joinable to the frame with said cover having the second electronic circuit and with said cover positioning said second set of electrical contacts;

a body mating surface shaped to engage a cover mating surface on the cover to join the cover to the body in a closed position, with said body mating surface and cover mating surfaces shaped to permit movement of the cover relative to the body when the cover and body are joined in the closed position; and, a post fixed in spaced relation to the first set of electrical contacts, said post adapted to engage an aperture in the cover to align the second set of electrical contacts so that as the cover is joined to the frame the second set of electrical contacts is aligned with the first set of electrical contacts;

wherein the first set of electrical contacts and second set of electrical contacts are held together when the cover is joined to the frame.

14. The camera of claim 13 wherein said frame defines more than one post and the cover defines more than one aperture.

15. The camera of claim 13, wherein the post is circular in cross section and the passageway is circular in cross section.

16. The camera of claim 13, wherein the post has cross sectional shape that is at least one of a square, triangle, star, rectangle, or polygon.

17. The camera of claim 13, wherein the post is tapered at an end confronting the cover.

18. The camera of claim 17, wherein said frame further comprises at least one additional circuit having at least one additional set of contacts.

19. The camera of claim 18, wherein said at least one additional set of contacts is adapted to engage at least one of the second set of electrical contacts of a second electronic circuit.

20. The camera of claim 18, wherein the first electronic circuit and additional electronic circuit are adapted to cooperate by way of the second electronic circuit to perform at least one camera function.

21. The camera of claim 13, wherein said second circuit is positioned on a second circuit board held by said cover.

22. The camera of claim 13, wherein said second circuit board is a flexible circuit hoard.

23. The camera of claim 13, wherein said second circuit board is movably held by said cover and said second circuit board comprises a passageway shaped to engage the post and align the second circuit board with the post.

24. The camera of claim 13, wherein after the cover is joined to the body, at least one of the contacts of the second set of contacts is selectably movable between a first position wherein the first set of contacts engage the second set of contacts and a second position wherein the first set of contacts is separate from the second set of contacts.

25. The camera of claim 13, wherein after the cover is joined to the body, at least one of the contacts of the first set of contacts is selectably movable between a first position wherein the first set of contacts engage the second set of contacts and a second position wherein the first set of contacts is separate from the second set of contacts.

26. The camera of claim 13, wherein said cover provides an outer surface and an inner surface confronting the frame, with said first electronic circuit assembled on the inner surface.

27. The camera of claim 13, wherein said cover provides an outer surface and an inner surface with a base therebetween and said second electronic circuit is positioned, at least in part, in the base.

28. The camera of claim 13, wherein said cover is formed from a common substrate and the parts of the second electronic circuit are positioned within the common substrate.

29. A camera comprising:
a frame joined to a first circuit board with the first circuit board having a passageway and a flash circuit, said flash circuit having a first set of electrical contacts adapted to engage a second set of electrical contacts from a second electronic circuit and to cooperate therewith to perform a set of camera functions when said first set of contacts is held against said second set of electrical contacts;
an image capture system is joined to the frame;
a cover having a second circuit board with the second circuit board having the second electronic circuit and the second set of electrical contacts, said cover positioning the second circuit board so that the second set of electrical contacts is movable relative to the cover; and
a post extending between the frame and the cover, with said post adapted to engage said passageway and said aperture to align the passageway and the aperture so that when the cover is joined to the frame the second set of electrical contacts is aligned with the first set of electrical contacts and the second set of contacts is held against the first set of electrical contacts.

30. The camera of claim 29, wherein said frame defines more than one post and wherein the first circuit board defines a passageway to engage each post and the second circuit board defines an aperture to engage each post.

31. The camera of claim 29, wherein the post is circular in cross section and the passageway is circular in cross section.

32. The camera of claim 29, wherein the post has cross sectional shape that is at least one of a square, triangle, star, rectangle, or polygon.

33. A method for assembling a camera comprising the steps of:
obtaining a base having a first electronic circuit adapted to join with more than one second electronic circuit;
identifying the desired set of functions that the camera is to perform;
providing a cover having a second electronic circuit that is movable relative to the cover and adapted to join with the first electronic circuit to perform the desired set of camera functions;
defining a common positional reference between the first electronic circuit and the second electronic circuit;
aligning the first electronic circuit and the second electronic circuit relative to the common positional reference; and,
positioning the first electronic circuit and the second electronic circuit together so that they can cooperate.

34. The method of claim 33, wherein the step of positioning the first circuit and the second circuit together is performed by the steps of providing a cover that is adapted to press the second electronic circuit against the first electronic circuit when the cover is joined to the frame and joining the cover to the frame.

35. The method of claim 34, wherein each of said more than one second electronic circuit is joined to a cover that has a distinguishing feature that identifies the functions that the camera is capable of performing when the cover is joined to the frame.

36. The method of claim 35, further comprising the step of detecting the distinguishing feature.

* * * * *